(12) United States Patent
Takeda

(10) Patent No.: US 8,126,025 B2
(45) Date of Patent: Feb. 28, 2012

(54) LASER LIGHT SOURCE APPARATUS, AND MONITORING APPARATUS AND IMAGE DISPLAY APPARATUS USING THE SAME

(75) Inventor: Takashi Takeda, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 1021 days.

(21) Appl. No.: 12/014,492

(22) Filed: Jan. 15, 2008

(65) Prior Publication Data

US 2008/0174738 A1    Jul. 24, 2008

(30) Foreign Application Priority Data

Jan. 22, 2007   (JP) ................................ 2007-011336

(51) Int. Cl.
*H01S 5/00* (2006.01)
(52) U.S. Cl. ........... 372/50.12; 372/21; 372/22; 372/23; 372/28; 372/34; 372/36; 353/94
(58) Field of Classification Search ............... 372/21, 372/22, 23, 28, 50.12, 34, 36; 353/94
See application file for complete search history.

(56) References Cited

U.S. PATENT DOCUMENTS

| | | | | |
|---|---|---|---|---|
| 6,021,141 A | * | 2/2000 | Nam et al. | ........................ 372/20 |
| 6,586,141 B1 | | 7/2003 | Efimov et al. | |
| 6,636,342 B2 | | 10/2003 | Furusawa et al. | |
| 6,673,497 B2 | | 1/2004 | Efimov et al. | |
| 7,322,704 B2 | * | 1/2008 | Shchegrov | ....................... 353/94 |
| 2002/0196414 A1 | * | 12/2002 | Manni et al. | ..................... 353/31 |
| 2006/0285076 A1 | * | 12/2006 | Takeda et al. | ................... 353/22 |
| 2008/0019010 A1 | * | 1/2008 | Govorkov et al. | ............ 359/641 |

FOREIGN PATENT DOCUMENTS

| | | |
|---|---|---|
| JP | A-2001-272706 | 10/2001 |
| JP | A 2003-188455 | 7/2003 |
| JP | A 2004-503923 | 2/2004 |
| JP | A 2006-317662 | 11/2006 |
| WO | WO 02/05038 A2 | 1/2002 |

* cited by examiner

Primary Examiner — Yuanda Zhang
(74) Attorney, Agent, or Firm — Oliff & Berridge PLC

(57) ABSTRACT

A laser light source apparatus includes a first laser array light source that emits first-wavelength light, and a second laser array light source that emits second-wavelength light, the second wavelength being different from the first wavelength. The first laser array light source includes a first fundamental wave laser array that produces first fundamental wave light having a first original wavelength, and a first wavelength conversion element that wavelength-converts the first fundamental wave light into the first-wavelength light. The second laser array light source includes a second fundamental wave laser array that produces second fundamental wave light having a second original wavelength different from the first original wavelength, and a second wavelength conversion element that wavelength-converts the second fundamental wave light into the second-wavelength light.

8 Claims, 16 Drawing Sheets

LASER LIGHT SOURCE APPARATUS, AND MONITORING APPARATUS AND IMAGE DISPLAY APPARATUS USING THE SAME

BACKGROUND

1. Technical Field

The present invention relates to a laser light source apparatus having a wavelength conversion element.

2. Related Art

To enhance the brightness of an image display apparatus, such as a projector, a laser light source is used as the light source apparatus in some cases. Such a laser light source uses a more efficient, longer-wavelength laser light source and a wavelength conversion element to provide visible laser light.

JP-T-2004-503923 is an example of related art (the term "JP-T" as used herein means a published Japanese translation of a PCT patent application).

The visible laser light provided by such wavelength conversion, however, also has higher coherence than that of a discharge lamp light source and the like. Laser light interference therefore occurs, so that speckle noise appears on the image projection screen of the image display apparatus. Such speckle noise could disadvantageously reduce image quality of the projected image. Such a problem may occur not only in the light source apparatus used in an image display apparatus but also in various apparatuses that require light source apparatuses, such as illumination apparatuses

SUMMARY

An advantage of some aspects of the invention is to reduce the coherence of the laser light emitted from a laser light source having a wavelength conversion element.

A laser light source apparatus according to an aspect of the invention includes a first laser array light source that emits first-wavelength light and a second laser array light source that emits second-wavelength light, the second wavelength being different from the first wavelength. The first laser array light source includes a first fundamental wave laser array that produces first fundamental wave light having a first original wavelength and a first wavelength conversion element that wavelength-converts the first fundamental wave light into the first-wavelength light, and the second laser array light source includes a second fundamental wave laser array that produces second fundamental wave light having a second original wavelength different from the first original wavelength and a second wavelength conversion element that wavelength-converts the second fundamental wave light into the second-wavelength light.

According to this configuration, the second laser array light source emits laser light having a wavelength different from that of the laser light emitted from the first laser array light source. The laser light that exist from the laser light source apparatus therefore contains a plurality of laser light having wavelengths different from one another, so that the coherence of the laser light that exits from the laser light source apparatus can be reduced.

Each of the first and second fundamental wave laser arrays may include first and second mirrors that reflect light having the first and second original wavelengths and hence form a cavity, and a wavelength selection element and a gain medium provided between the first and second mirrors, the wavelength selection element selectively transmitting light having a specific wavelength, the gain medium having a gain band for a specific wavelength range. The wavelength selection elements in the first and second fundamental wave laser arrays may be of the same type. The wavelength selection element in the first fundamental wave laser array may transmit the light having the first original wavelength, and the gain band of the gain medium in the first fundamental wave laser array may be set in such a way that laser oscillation occurs in the gain medium at the first original wavelength. The wavelength selection element in the second fundamental wave laser array may transmit the light having the second original wavelength, and the gain band of the gain medium in the second fundamental wave laser array may be set in such a way that laser oscillation occurs in the gain medium at the second original wavelength.

According to this configuration, the wavelength selection elements provided in the cavities are used to set the laser oscillation wavelengths of the first and second fundamental wave laser arrays, so that the laser light emitted from the first and second laser array light sources can be of different wavelengths. Further, the use of the wavelength selection elements of the same type can prevent increase in the number of types of the wavelength selection element to be used.

The wavelength selection elements in the first and second fundamental wave laser arrays may have the same transmission characteristic that allows selective transmission of both the first and second original wavelengths.

According to this configuration, oscillation can occur in the fundamental wave laser array either at the first or second original wavelength by setting the gain band of the fundamental wave laser array. It is therefore not necessary to set different transmission wavelengths for the wavelength selection elements in the first and second fundamental wave laser arrays.

The wavelength selection elements in the first and second fundamental wave laser arrays may have the same transmission characteristic in which the selectively transmitted wavelength changes according to the angle at which the incidence light impinges on the wavelength selection element. The wavelength selection elements in the first and second fundamental wave laser arrays may be disposed in such a way that the inclination angle of the wavelength selection element to the resonance direction of the cavity in the first fundamental wave laser array differs from the inclination angle of the wavelength selection element to the resonance direction of the cavity in the second fundamental wave laser array.

According to this configuration, by adjusting the inclination angle of each of the wavelength selection elements to the resonance direction, the transmission wavelengths of the wavelength selection elements in the first and second fundamental wave laser arrays can be of different wavelengths.

Each of the wavelength selection elements of the same type may use an actuator provided therein to change the wavelength selection state thereof so as to change the selectively transmitted wavelength. The wavelength selection state of the wavelength selection element in the first fundamental wave laser array may be set to be different from that of the wavelength selection element in the second fundamental wave laser array.

According to this configuration, the actuator is used to adjust the wavelength selection state of each of the wavelength selection elements, the transmission wavelengths of the wavelength selection elements in the first and second fundamental wave laser array can be of different wavelengths.

Each of the first and second wavelength conversion elements may have different wavelength conversion efficiencies for different wavelengths of the fundamental wave light. The wavelength conversion element in the first laser array light source may have higher wavelength conversion efficiency at the first original wavelength than at the second original wavelength, and the wavelength conversion element in the second laser array light source may have higher wavelength conversion efficiency at the second original wavelength than at the first original wavelength.

According to this configuration, the wavelength conversion is carried out by the wavelength conversion element appropriate to the first original wavelength and the wavelength conversion element appropriate to the second original wavelength. The wavelength conversion efficiencies can therefore be higher both in the first and second laser array light sources.

The first and second wavelength conversion elements may be of the same type in which the wavelength at which the wavelength conversion efficiency is higher than predetermined efficiency changes with temperature. The first laser array light source may have a first temperature adjuster that adjusts the temperature of the first wavelength conversion element in such a way that the wavelength conversion efficiency at the first original wavelength is higher than the predetermined efficiency, and the second laser array light source may have a second temperature adjuster that adjusts the temperature of the second wavelength conversion element in such a way that the wavelength conversion efficiency at the second original wavelength is higher than the predetermined efficiency.

According to this configuration, the use of the wavelength conversion elements of the same type can prevent increase in the number of types of the wavelength conversion element to be used.

The invention can be implemented in various aspects. For example, the invention can be implemented in the following aspects: a laser light source apparatus, and a monitoring apparatus and an image display apparatus using the laser light source apparatus.

BRIEF DESCRIPTION OF THE DRAWINGS

The invention will now be described with reference to the accompanying drawings, wherein like numbers refer to like elements.

DESCRIPTION OF EXEMPLARY EMBODIMENTS

An embodiment of the invention will be described below with reference to embodiments in the following order:
A. First embodiment:
B. Second embodiment:
C. Third embodiment:
D. Fourth embodiment:
E. Fifth embodiment:
F. Sixth embodiment:
G. Seventh embodiment:
H. Eighth embodiment:
I. Ninth embodiment:
J. Tenth embodiment:
K. Variations:

A. First Embodiment

Figure 1:
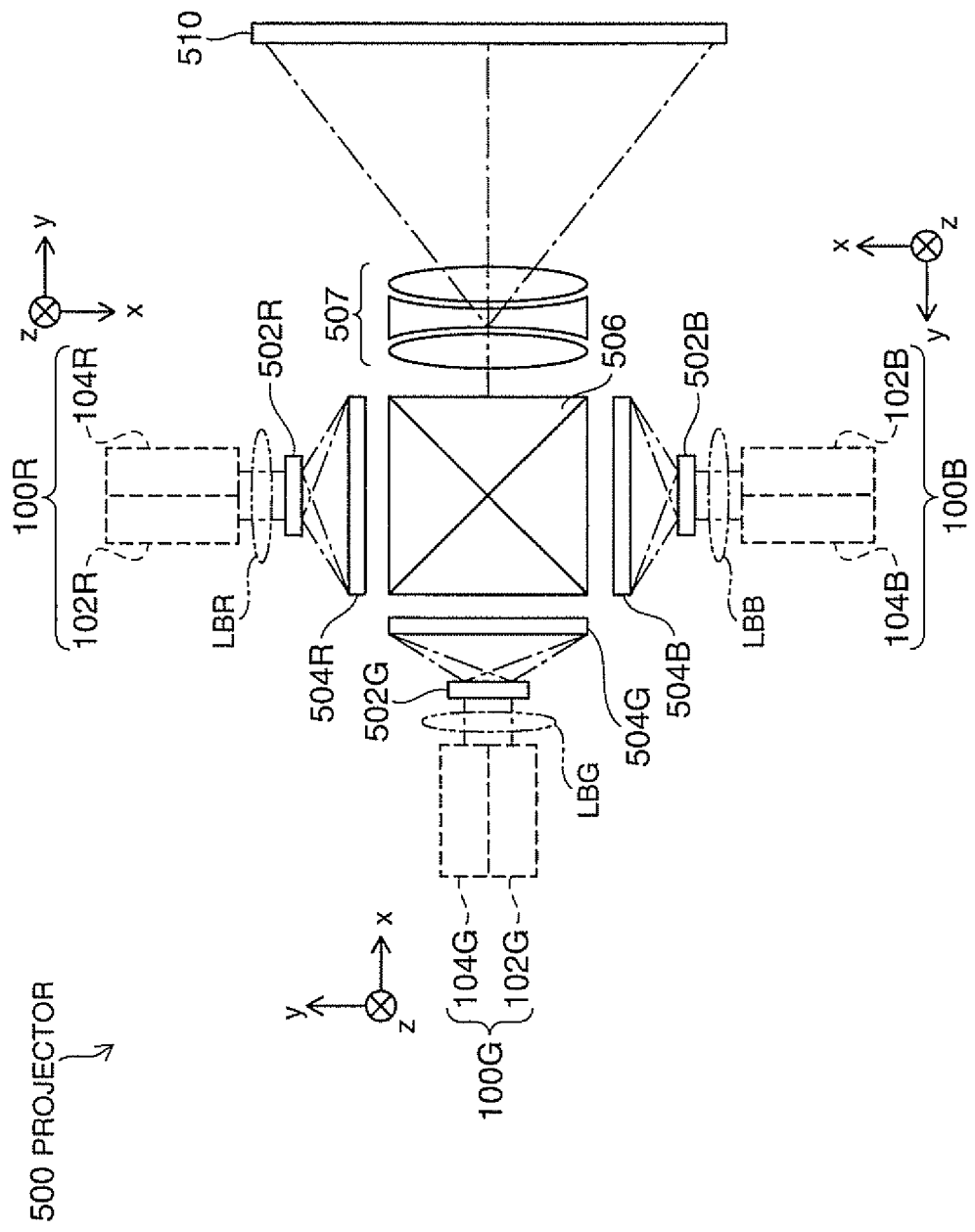
FIG. 1 is a schematic configuration diagram of a projector to which a first embodiment of the invention is applied.

FIG. 1 is a schematic configuration diagram of a projector to which a first embodiment of the invention is applied. The projector 500 includes a red light emitting laser light source apparatus 100R, a green light emitting laser light source apparatus 100G and a blue light emitting laser light source apparatus 100B. The red laser light source apparatus 100R is formed by stacking two laser array light sources 102R and 104R, each emitting red laser light. Similarly, the green laser light source apparatus 100G is formed by stacking green laser array light sources 102G and 104G, and the blue laser light source apparatus 100B is formed by stacking blue laser array light sources 102B and 104B.

The projector 500 further includes homogenizing optical systems 502R, 502G, and 502B and liquid crystal light valves 504R, 504G, and 504B for respective colors. The projector 500 further includes a cross dichroic prism 506 and a projection lens 507. The cross dichroic prism 506 combines the light beams that exit through the liquid crystal light valves 504R, 504G, and 504B.

The homogenizing optical systems 502R, 502G, and 502B are optical systems for illuminating the liquid crystal light valves 504R, 504G, and 504B with the respective color laser light beams LBR, LBG, and LBB emitted from the color light emitting laser light source apparatuses 100R, 100G, and 100B. Each of the homogenizing optical systems 502R, 502G, and 502B is formed of, for example, a hologram, such as a computer generated hologram (CGH), or a lens array, and homogenizes the brightness distribution at the corresponding one of the liquid crystal light valves 504R, 504G, and 504B. The liquid crystal light valves 504R, 504G, and 504B modulate the respective illumination color light beams traveling through the homogenizing optical systems 502R, 502G, and 502B according to an image signal sent from a personal computer or the like (not shown).

The three color light beams modulated by the respective liquid crystal light valves 504R, 504G, and 504B are incident on the cross dichroic prism 506. The prism is formed by bonding four rectangular prisms and thus has internal surfaces that intersect each other. One of the internal surfaces has a dielectric multilayer film that reflects red light, and the other internal surface has a dielectric multilayer film that reflects blue light. The combined light is projected through the projection lens 507 onto a screen 510 to display an enlarged image.

The laser light source apparatuses 100R, 100G, and 100B have substantially the same configuration, and so do the laser array light sources 102R, 104R, 102G, 104G, 102B, and 104B. The green laser light source apparatus 100G will be described as a representative laser light source apparatus 100 of all the laser light source apparatuses 100R, 100G, and 100B, and the green laser array light sources 102G and 104G will be described as representative laser array light sources 102 and 104 of all the color laser array light sources 102R, 104R, 102G, 104G, 102B, and 104B.

Figure 2A:
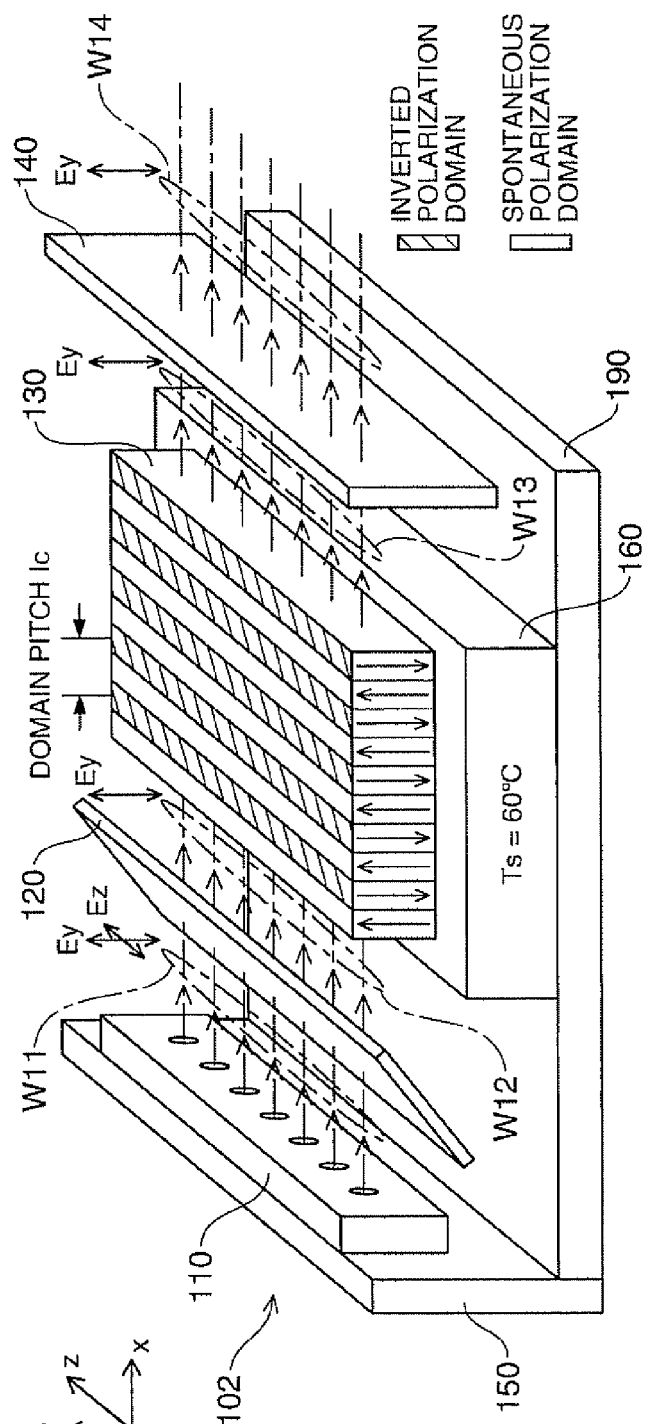
FIGS. 2A and 2B explain the configuration of a laser array light source 102.

FIG. 2A is a perspective view showing the configuration of the laser array light source 102. The laser array light source 104 has the same configuration as that of the laser array light source 102. The laser array light source 102 includes a vertical cavity surface emitting laser array 110 (hereinafter also referred to as "VCSEL array 110"), a polarizing beam splitter 120, a wavelength conversion element 130, and a reflection mirror 140. A substrate 150 on which the VCSEL array 110 is mounted and a Peltier element 160 that controls the temperature of the wavelength conversion element 130 are attached to a base 190.

Figure 2B:
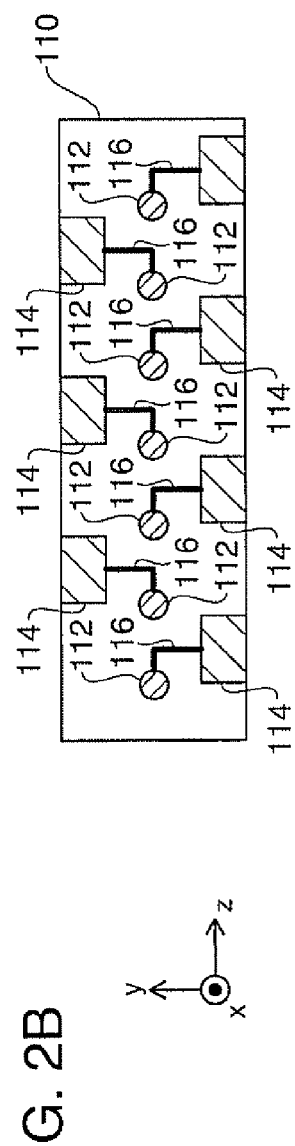

The VCSEL array 110 is a laser array that emits laser light having an emission wavelength of 1060 nm in the x-axis arrow direction in FIG. 2A. (The x-axis arrow direction is hereinafter also referred to as the "+x" direction, and the direction opposite to the +x direction is hereinafter also referred to as the "−x" direction. The same notation applies to the y and z axes.) FIG. 2B shows the VCSEL array 110 viewed from the +x direction. The VCSEL array 110 includes seven light emitting portions 112, seven bonding pads 114, and wiring lines 116, each connecting each of the light emitting portions 112 to the corresponding one of the bonding pads 114. By applying voltages to the seven bonding pads 114, the seven light emitting portions 112 emit laser light in the +x direction. As shown in FIG. 2B, in the VCSEL array 110 in the first embodiment, the light emitting portions 112 are positioned substantially at the center of the VCSEL array 110.

In general, each of the light emitting portions 112 of the VCSEL array 110 does not have anisotropy in the y and z axis directions perpendicular to the laser emission direction (x axis direction). Therefore, as indicated by the arrows in FIG. 2A, the exit beam W11 from the VCSEL array 110 is not polarized in a specific direction, but has an electric field component Ey in the y axis direction and an electric field component Ez in the z axis direction.

The exit beam W11 from the VCSEL array 110 travels in the +x direction and reaches the polarizing beam splitter 120. The polarizing beam splitter 120 selectively transmits the P polarization component (that is, the polarization component Ey in the y axis direction) of the exit beam W11. The beam W12 that has passed through the polarizing beam splitter 120 further travels in the +x direction and reaches the wavelength conversion element 130.

In the first embodiment, periodically poled LiNbO$_3$ (PPLN) is used as the material of the wavelength conversion element 130. A PPLN crystal functions as a second harmonic generation (SHG) element that matches the optical length of the polarization inversion domain period (domain pitch), formed of the spontaneous polarization domain and the inverted polarization domain, with the wavelength of the incident light so as to convert the incident light (also called "fundamental wave light") having the electric field component Ez parallel to the direction of the polarization domain into second harmonic light having a frequency twice as high as the frequency of the incident light. The domain pitch and the refractive index of the wavelength conversion element 130 change with the temperature thereof. To maintain the state in which the wavelength of the incident light matches with the optical length of the domain pitch, the wavelength conversion element 130 is attached to the Peltier element 160 for temperature control of the wavelength conversion element 130 as shown in FIG. 2A. In the example shown in FIG. 2A, the Peltier element 160 adjusts the temperature Ts of the wavelength conversion element 130 to 60° C. Although the wavelength conversion element 130 is made of PPLN in the first embodiment, the wavelength conversion element can be made of various ferroelectrics having a polarization inversion domain structure. Examples of the ferroelectrics that can be used for the wavelength conversion element may include lithium tantalite (LT: LiTaO$_3$), potassium titanyl phosphate (KTP: KTiOPO$_4$), and potassium niobate (KN: KNbO$_3$).

In the example shown in FIG. 2A, the direction of the polarization domain of the wavelength conversion element 130 is oriented in the +y direction in the non-hatched spontaneous polarization domain, while being oriented in the −y direction in the hatched inverted polarization domain. Since the direction of the polarization domain of the wavelength conversion element 130 is thus parallel to the y axis, the beam W12 that has passed through the polarizing beam splitter 120 is converted into the light (second harmonic light) having a wavelength half as long as the wavelength of the fundamental wave light (also called "original wavelength"). Then, the beam W13, containing the second harmonic light that has been wavelength-converted and the fundamental wave light that has passed through the wavelength conversion element 130 but has not been wavelength-converted, exits from the wavelength conversion element 130. In the example shown in FIG. 2A, since the wavelength of the fundamental wave light W12 is approximately 1060 nm, which is the wavelength of the exit beam W11 from the VCSEL array 110, the beam W13 contains the second harmonic light having a wavelength of approximately 530 nm and the fundamental wave light having a wavelength of approximately 1060 nm.

The beam W13 further travels in the +x direction and reaches the reflection mirror 140. The reflection mirror 140 selectively reflects the light having a wavelength of approximately 1060 nm. The second harmonic light contained in the beam W13 passes through the reflection mirror 140, so that the beam W14 (exit beam) substantially free of the fundamental wave light exits from the laser array light source 102. On the other hand, the fundamental wave light contained in the beam W13 is reflected off the reflection mirror 140 and returns to the VCSEL array 110 through the wavelength conversion element 130 and the polarizing beam splitter 120. In the VCSEL array 110, the returned fundamental wave light excites the active layer, which is the gain medium of the VCSEL array 110, and the energy of the returned fundamental wave light is used to produce the beam W11. A reflection mirror that selectively reflects light having a specific wavelength, such as the reflection mirror 140, can be formed of an optical multiplayer film obtained by stacking a plurality of dielectric thin films (such as a $TiO_2$ layer and an $SiO_2$ layer).

Figure 3B:
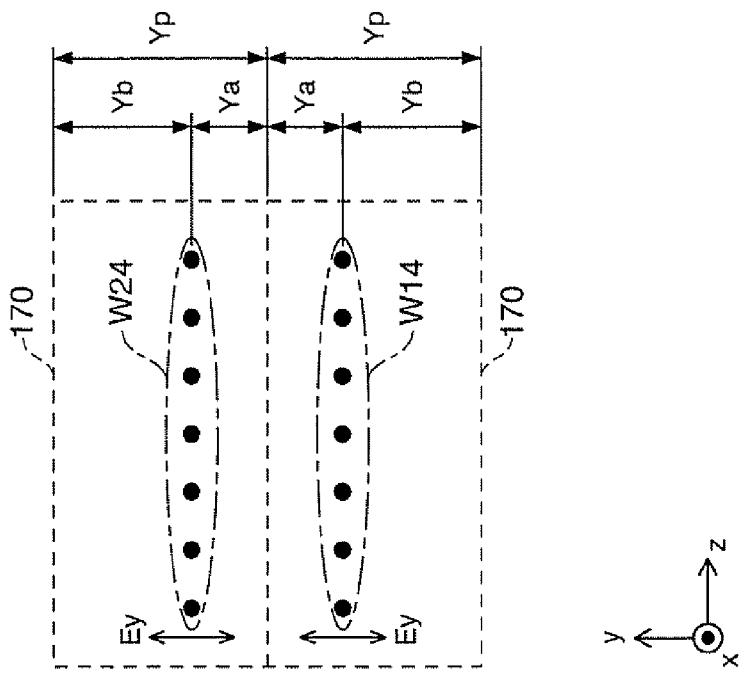
FIGS. 3A and 3B explain the configuration of the laser light source apparatus 100 in a first embodiment.
Figure 3A:
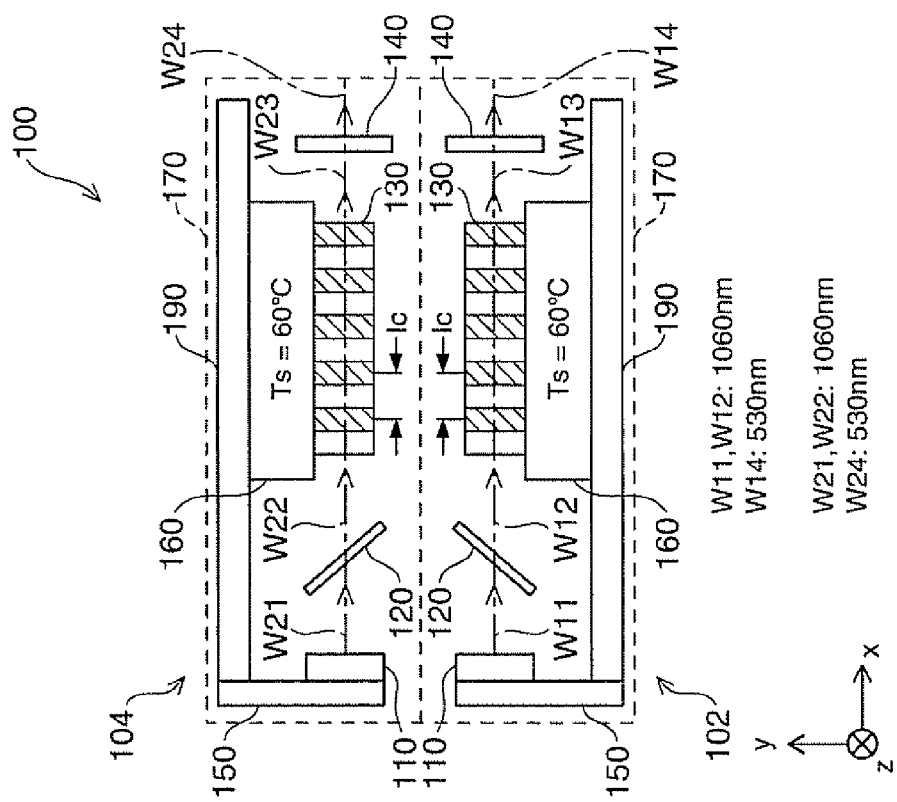

FIG. 3A shows the laser light source apparatus 100 including the laser array light source 102 shown in FIG. 2A and the laser array light source 104 having the same configuration as that of the laser array light source 102, the laser array light sources 102 and 104 disposed adjacent to each other in the y axis direction. Since the laser array light sources 102 and 104 are separate units, each of them can also be referred to as a "laser array light source unit." FIG. 3A also shows packages 170 for the laser array light sources 102 and 104. FIG. 3B shows the positional relationship of the exit positions of the beams W14, W24 that exit from the thus formed laser light source apparatus 100 with respect to the packages 170 for the laser array light sources 102 and 104. As shown in FIG. 3B, the region from which each of the beams W14 and W24 exits is herein also referred to as a laser light exit region. Each of the laser light exit regions is longer in the z axis direction than in the y axis direction because the light emitting portions of the VCSEL array 110 are arranged in the z axis direction.

The thickness of the Peltier element 160 is typically larger than the length of the VCSEL array 110 in the y axis direction and the thickness of the wavelength conversion element 130. Therefore, as shown in FIG. 3B, the exit positions of the beams W14 and W24 are offset from the center of the respective packages 170 in the y axis direction. Specifically, in the first laser array light source 102, the distance Ya between the exit beam W14 and the +y direction-side surface of the package 170 (that is, the surface on the base 190 side) is smaller than the distance Yb between the exit beam W14 and the −y direction-side surface of the package 170 (the surface on the laser array light source connection side). In the second laser array light source 104, the distance Ya between the exit beam W24 and the −y direction-side surface of the package 170 (that is, the surface on the base 190 side) is smaller than the distance Yb between the exit beam W24 and the +y direction-side surface of the package 170 (the surface on the laser array light source connection side).

In the first embodiment, as shown in FIG. 3A, the first laser array light source 102 is disposed in such a way that the base 190 is located on the −y direction side, while the second laser array light source 104 is disposed in such a way that the base 190 is located on the +y direction side. Therefore, the distance between the exit beam W14 from the first laser array light source 102 and the exit beam W24 from the second laser array light source is shorter than Yp, which is the length of each of the packages 170 for the laser array light sources 102 and 104 in the y axis direction. By thus reducing the distance between the exit beam W14 from the first laser array light source 102 and the exit beam W24 from the second laser array light source 104, the size of the homogenizing optical system 502G (FIG. 1) can be reduced. By reducing the size of the homogenizing optical system 502G, the angle of incidence at which the light from the homogenizing optical system 502G enters the liquid crystal light valve 504G (FIG. 1) can be smaller. It is therefore possible to further mitigate the reduction in contrast of the light modulated by the liquid crystal light valve 504G due to the increase in the angle of incidence.

Both the exit beam W14 from the first laser array light source 102 and the exit beam W24 from the second laser array light source 104 are polarized in the y axis direction. Therefore, even when no polarization control element for aligning the polarization directions, such as a polarizer or a polarizing beam splitter, is provided, the liquid crystal light valve 504G can perform the light modulation.

As described above, in the first embodiment, since the two laser array light sources 102 and 104 are disposed in such a way that the surfaces close to the exit beams W14 and W24 are adjacent to each other, the distance between the exit beams W14 and W24 is reduced. By thus reducing the distance between the exit beams W14 and W24, it is possible to further reduce the size of the homogenizing optical system 502G and further enhance the contrast of the light modulated by the liquid crystal light valve 504G.

In the first embodiment, the exit beam W14 from the first laser array light source 102 and the exit beam W24 from the second laser array light source 104 are polarized in the same direction. Therefore, no polarization control element is necessary to align the polarization directions of the exit beams W14 and W24, so that the size of the projector 500 (FIG. 1) can be further reduced, and reduction in the amount of light due to the polarization control element can be smaller.

B. Second Embodiment

Figure 4B:
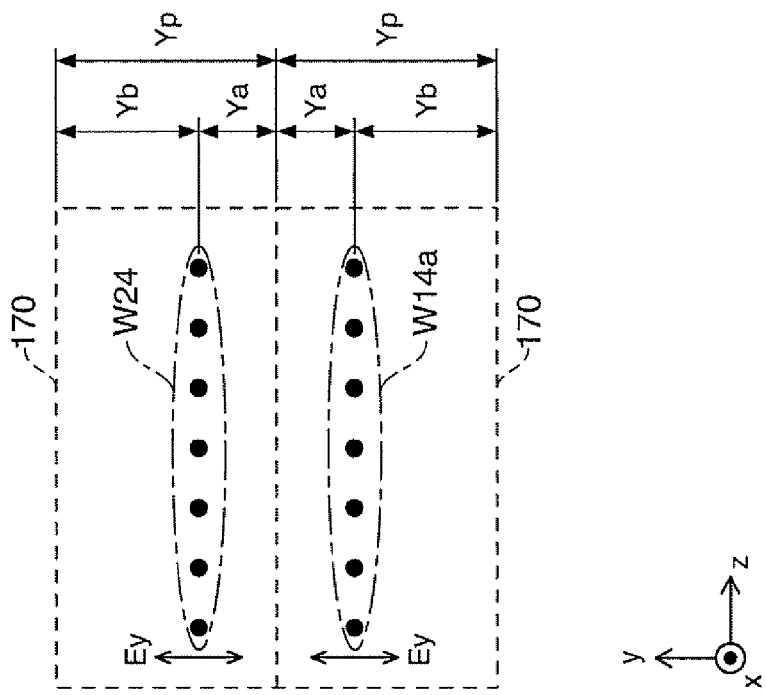
FIGS. 4A and 4B explain the configuration of the laser light source apparatus 100a in a second embodiment.
Figure 4A:
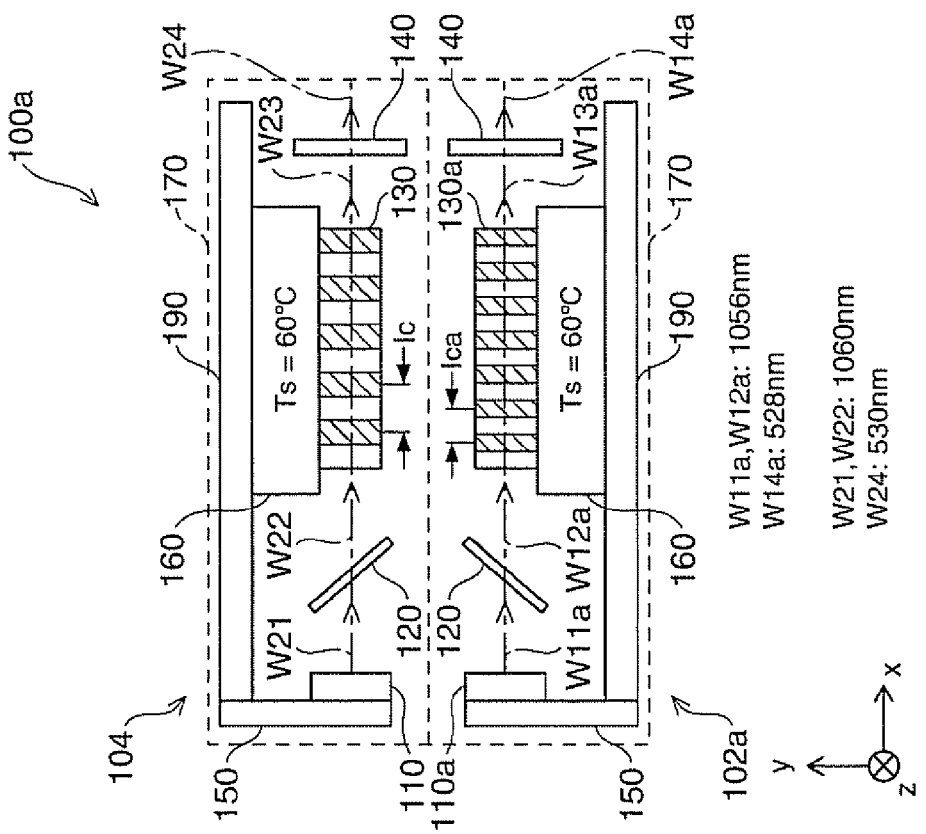

FIG. 4A is a configuration diagram showing the configuration of the laser light source apparatus 100a in a second embodiment. The laser light source apparatus 100a of the second embodiment differs from the laser light source apparatus 100 of the first embodiment shown in FIG. 3A in that the configuration of a first laser array light source 102a is different. Specifically, a VCSEL array 110a and a wavelength conversion element 130a differ from the VCSEL array 110 and the wavelength conversion element 130 in the first embodiment. The other components are the same as those in the first embodiment. FIG. 4B shows the positional relationship of the exit positions of the beams W14a, W24 that exit from the laser light source apparatus 100a of the second embodiment with respect to the packages 170 for the laser array light sources 102a and 104. The positional relationship is the same as that in the first embodiment shown in FIG. 3B except that the exit beam W14 is replaced with the exit beam W14a.

Figure 5A:
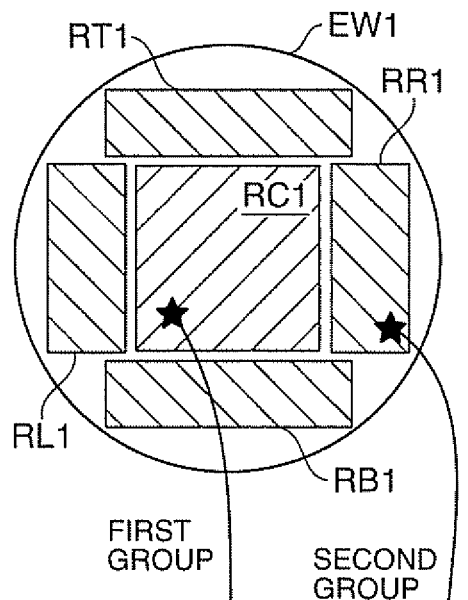
FIGS. 5A, 5B and 5C explain how to obtain VCSEL arrays having emission wavelengths different from one another.
Figure 5B:
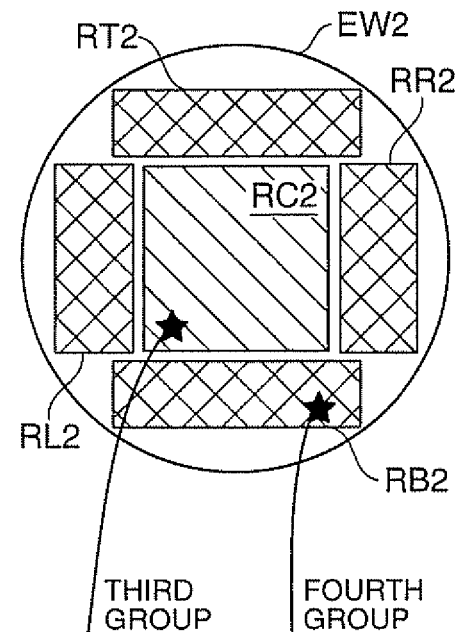
Figure 5C:
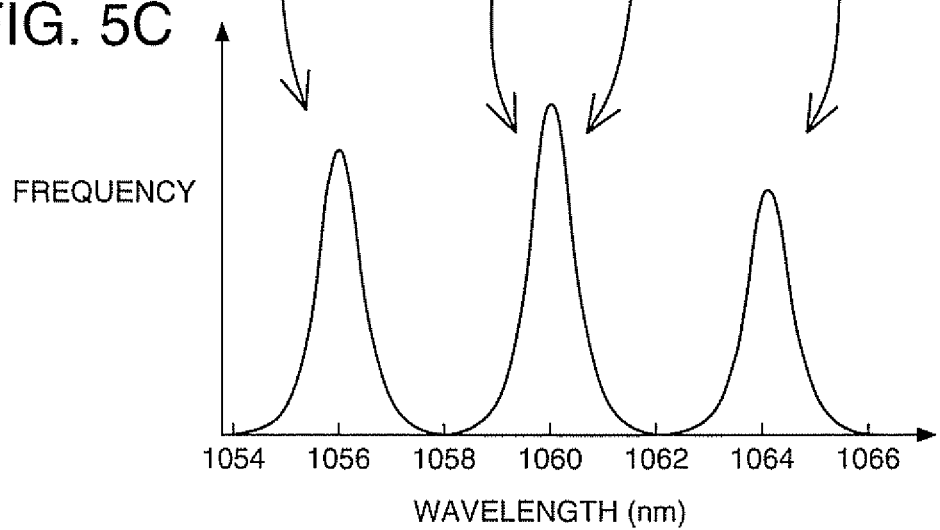

In the first laser array light source 102a of the second embodiment, the VCSEL array 110a having an emission wavelength of approximately 1056 nm differs from the VCSEL array 110 in the first embodiment having an emission wavelength of approximately 1060 nm. FIGS. 5A, 5B and 5C show how to obtain the VCSEL arrays 110 and 110a having emission wavelengths different from each other. FIGS. 5A and 5B show epitaxial wafers (epi-wafers) EW1 and EW2 before VCSEL arrays are cut out. The epi-wafers EW1 and EW2 are manufactured in respective batches different from each other.

In the epi-wafers EW1 and EW2, the thickness values of the Bragg reflector layer and the vertical cavity layer, which form the VCSEL array, in the peripheral portion typically differ from those in the central portion. The emission wavelength of the VCSEL array therefore follows the in-plane distribution of the thickness values of these layers, and differs according to whether the VCSEL array is obtained from the peripheral portion or the central portion of the epi-wafers EW1 and EW2. Further, the thickness values of the Bragg reflector layer and the vertical cavity layer vary batch to batch in the epi-wafer manufacturing process. Therefore, the emission wavelength of the VCSEL array, even when cut out from a similar location, varies batch to batch in the epi-wafer manufacturing process. Such variation in emission wavelength occurs not only in a VCSEL array but also in the whole range of laser array elements. For example, in an edge emitting type laser array element, variation in composition of the active layer, such as the mixed crystal ratio, changes the emission wavelength.

In the second embodiment, the epi-wafer EW1 is first divided into a central area RC1 of the epi-wafer EW1 and peripheral areas RT1, RB1, RR1, and RL1 of the epi-wafer EW1. By classifying VCSEL arrays obtained from the peripheral areas AT1, RB1, RR1, and RL1 as a first group, and VCSEL arrays obtained from the central area RC1 as a second group, VCSEL arrays having different emission wavelengths can be grouped. Similarly, by classifying VCSEL arrays obtained from the central area RC2 of the epi-wafer EW2 as a third group, and VCSEL arrays obtained from the peripheral areas RT2, RB2, RR2, and RL2 of the epi-wafer EW2 as a fourth group, VCSEL arrays having different emission wavelengths can be obtained.

FIG. 5C is a frequency distribution curve showing the number of thus obtained VCSEL arrays versus emission wavelength. In the example shown in FIG. 5C, the first group obtained from the central area RC1 of the first epi-wafer EW1 includes more VCSEL arrays having an emission wavelength of approximately 1056 nm than those having other emission wavelengths. On the other hand, the second group obtained from the peripheral areas RT1, RB1, RR1, and RL1 of the first epi-wafer EW1 includes more VCSEL arrays having an emission wavelength of approximately 1060 nm than those having other emission wavelengths. The third group obtained from the central area RC2 of the second epi-wafer EW2 includes more VCSEL arrays having an emission wavelength of approximately 1060 nm than those having other emission wavelengths. On the other hand, the fourth group obtained from the peripheral areas RT2, RB2, RR2, and RL2 of the second epi-wafer EW2 includes more VCSEL arrays having an emission wavelength of approximately 1064 nm than those having other emission wavelengths.

As described above, by classifying the VCSEL arrays having different emission wavelengths into a plurality of groups, VCSEL arrays that emit light at desired emission wavelengths can be obtained. In the example shown in FIG. 4A, the thus obtained VCSEL array 110a having an emission wavelength of approximately 1056 nm and the thus obtained VCSEL array 110 having an emission wavelength of approximately 1060 nm are used to form the first laser array light source 102a and the second laser array light source 104, respectively.

In the first laser array light source 102a, the wavelength of the fundamental wave light W11a and W12a is approximately 1056 nm. The domain pitch lca of the wavelength conversion element 130a in the first laser array light source 102a is therefore set to be shorter than the domain pitch lc of the wavelength conversion element 130 in the second laser array 104, so that the domain pitch lca matches with the wavelength of the fundamental wave light W11a and W12a. The wavelength conversion element 130a thus converts the fundamental wave light W12a having a wavelength of approximately 1056 nm into second harmonic light having a wavelength of approximately 528 nm. Then, the beam W14a having a wavelength of approximately 528 nm exits from the first laser array light source 102a.

In general, in an edge emitting type laser array, the light emitting portions are not optically separated, so that a plurality of laser light beams emitted from the light emitting portions cause phase matching, resulting in increased coherence. In a VCSEL array as well, when the light emitting portions of the VCSEL array are not optically separated, for example, as in a VCSEL array fabricated by forming insulated portions using proton implantation, the exit light beams cause phase matching, resulting in increased coherence. On the other hand, in the second embodiment, the two laser array light sources 102a and 104, the exit beams W14a and W24 of which have wavelengths different from each other, are used to form the laser light source apparatus 100a. Therefore, the light rays projected from the projector 500 (FIG. 1) onto the screen 510 have lower coherence than that of the light having a single wavelength, because the projected light rays are mixed light rays having wavelengths different from each other. By thus reducing the coherence of the light rays projected onto the screen 510, the amount of the speckle noise on the screen 510 can be reduced.

Further, in the second embodiment, since the distance between the exit beams W14a and W24 can be reduced as in the first embodiment, it is possible to further reduce the size of the homogenizing optical system 502G (FIG. 1) and further increase the contrast of the light modulated by the liquid crystal light valve 504G (FIG. 1), as in the first embodiment. Moreover, since the exit beams W14a and W24 are polarized in the same direction, no polarization control element is necessary, so that reduction in the amount of light due to the polarization control element can be smaller.

In the second embodiment, although the emission wavelength of the VCSEL array 110a in the first laser array light source 102a is set to approximately 1056 nm and the emission wavelength the VCSEL array 110 in the second laser array light source 104 is set to approximately 1060 nm, the combination of the emission wavelengths of the VCSEL arrays 110 and 110a is not limited thereto. For example, the emission wavelength of the VCSEL array 110 may be set to approximately 1064 nm and the emission wavelength of the VCSEL array 110a may be set to approximately 1060 nm. Alternatively, the emission wavelength of the VCSEL array 110 may be set to approximately 1064 nm and the emission wavelength of the VCSEL array 110a may be set to approximately 1056 nm. In general, the difference in emission wavelength between the VCSEL arrays 110 and 110a may be any value but at least a predetermined value determined by an experiment or the like (4 nm, for example). In this case, the domain pitches of the wavelength conversion elements 130 and 130a are changed as appropriate according to the emission wavelengths of the VCSEL arrays 110 and 110a. Specifically, the VCSEL arrays are classified for each predetermined difference in emission wavelength, and a plurality of groups of wavelength conversion elements are prepared in such a way that the wavelength conversion efficiency is maximized (such a wavelength is referred to as "optimum conversion wavelength") within the wavelength ranges for the classified groups. Then, for each of the grouped emission wavelengths of the VCSEL arrays to be used, the wavelength conversion elements in the corresponding optimum conversion wavelength group are selected as the wavelength conversion elements suitable for the emission wavelengths of the VCSEL arrays.

C. Third Embodiment

Figure 6A:
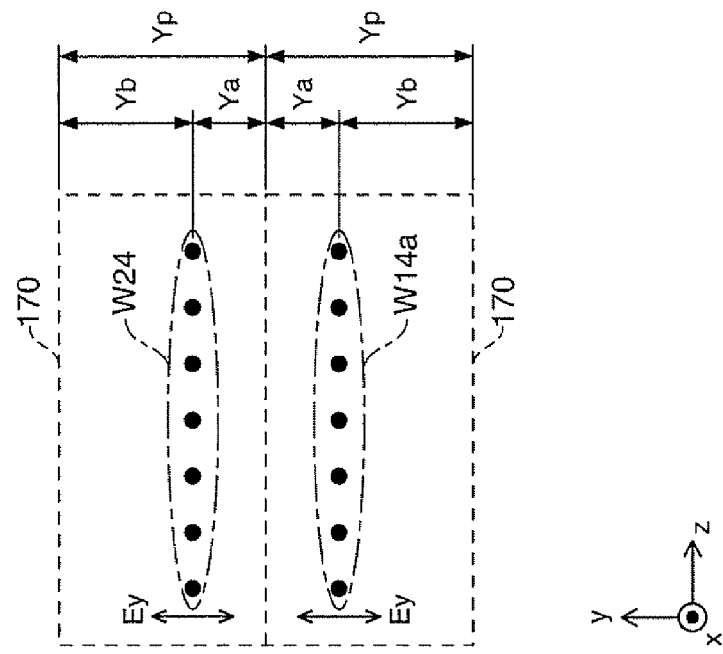
FIGS. 6A and 6B explain the configuration of the laser light source apparatus 100b in a third embodiment.
Figure 6B:
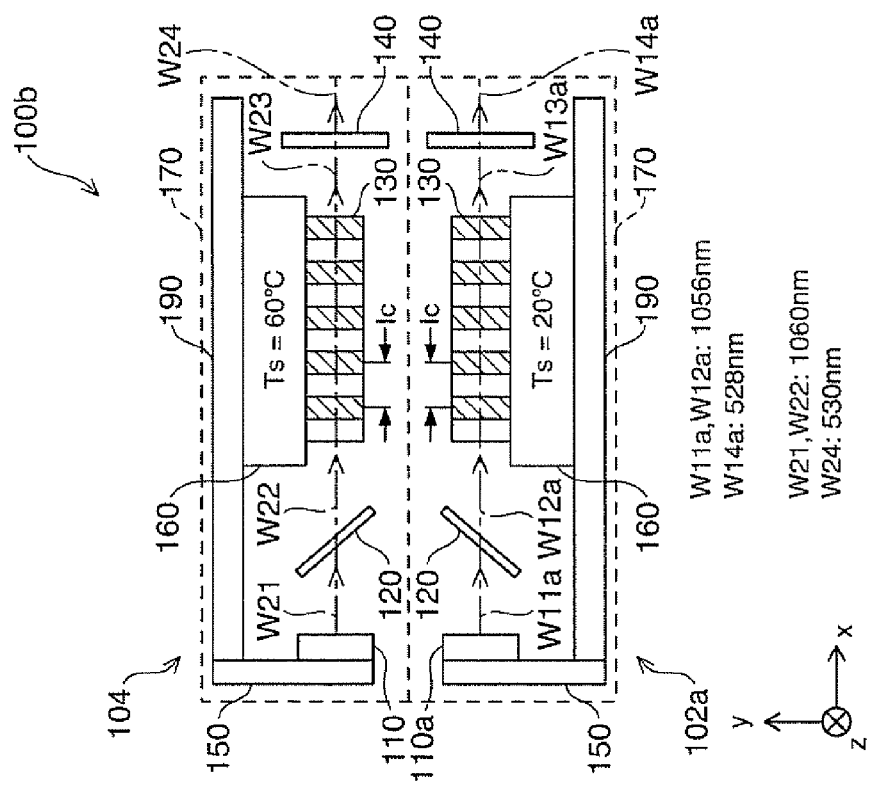

FIG. 6A is a configuration diagram showing the configuration of the laser light source apparatus 100b in a third embodiment. The laser light source apparatus 100b of the third embodiment differs from the laser light source apparatus 100a of the second embodiment shown in FIG. 4A in that the wavelength conversion element in the first laser array light source 102a is replaced with the wavelength conversion element 130 of the same wavelength as the wavelength conversion element 130 in the second laser array light source 104, and in that the temperature Ts of the wavelength conversion element 130 in the first laser array light source 102a is set to 20° C. The other components are the same as those in the second embodiment.

As described above, the optical length of the domain pitch of the wavelength conversion element 130 varies with the temperature of the wavelength conversion element 130. When PPLN is used, as in the case of the third embodiment, the optimum conversion wavelength of the wavelength conversion element increases by approximately 0.1 nm whenever the temperature increases by 1° C. Thus, by setting the temperature Ts of the wavelength conversion element 130 in the first laser array light source 102*a* to 20° C., which is 40° C. lower than the temperature (60° C.) of the wavelength conversion element 130 in the second laser array light source 104, the optimum conversion wavelength can be reduced by 4 nm. Then, by reducing the optimum conversion wavelength of the wavelength conversion element 130 in the first laser array light source 102*b* by 4 nm, the fundamental wave light W11*a*, W12*a* having an emission wavelength of approximately 1056 nm is converted into second harmonic light having a wavelength of approximately 528 nm, which then exits from the first laser array light source 102*b*.

As described above, in the third embodiment, the temperatures Ts of the wavelength conversion elements 130 are changed, so that the optimum conversion wavelengths of the wavelength conversion elements 130 match with the different emission wavelengths of the VCSEL arrays 110 and 110*a*. The laser light source apparatus 100*b* can therefore be configured in such a way that the wavelength conversion elements 130 of the same type output the second harmonic light beams W14*a* and W24 having wavelengths different from each other. In this case, the wavelength conversion element 130 is prepared in such a way that at the central temperature (60° C.) of a predetermined temperature range (20° C. to 100° C., for example), the optimum conversion wavelength coincides with the central wavelength (1060 nm, for example) of the variation range of the emission wavelength of the VCSEL array. The predetermined temperature range is set, for example, based on the operating temperature of the laser light source apparatus 100*b*.

In the third embodiment, the amount of speckle noise can be reduced and the distance between the exit beams W14*a* and W24 can be reduced, as in the second embodiment It is therefore possible to further reduce the size of the homogenizing optical system 502G (FIG. 1) and further increase the contrast of the light modulated by the liquid crystal light valve 504G (FIG. 1). Further, since the exit beams W14*a* and W24 are polarized in the same direction, no polarization control element is necessary, so that reduction in the amount of light due to the polarization control element can be smaller.

The third embodiment is preferable to the second embodiment in that the number of types of the wavelength conversion element used in the laser light source apparatus 100*b* can be reduced. On the other hand, in the second embodiment, the temperatures of the wavelength conversion elements in the first and second laser array light sources 102*a* and 104 can be the same value. The second embodiment is thus preferable to the third embodiment in that the temperature control performed by the Peltier element 160 is easier.

D. Fourth Embodiment

Figure 7:
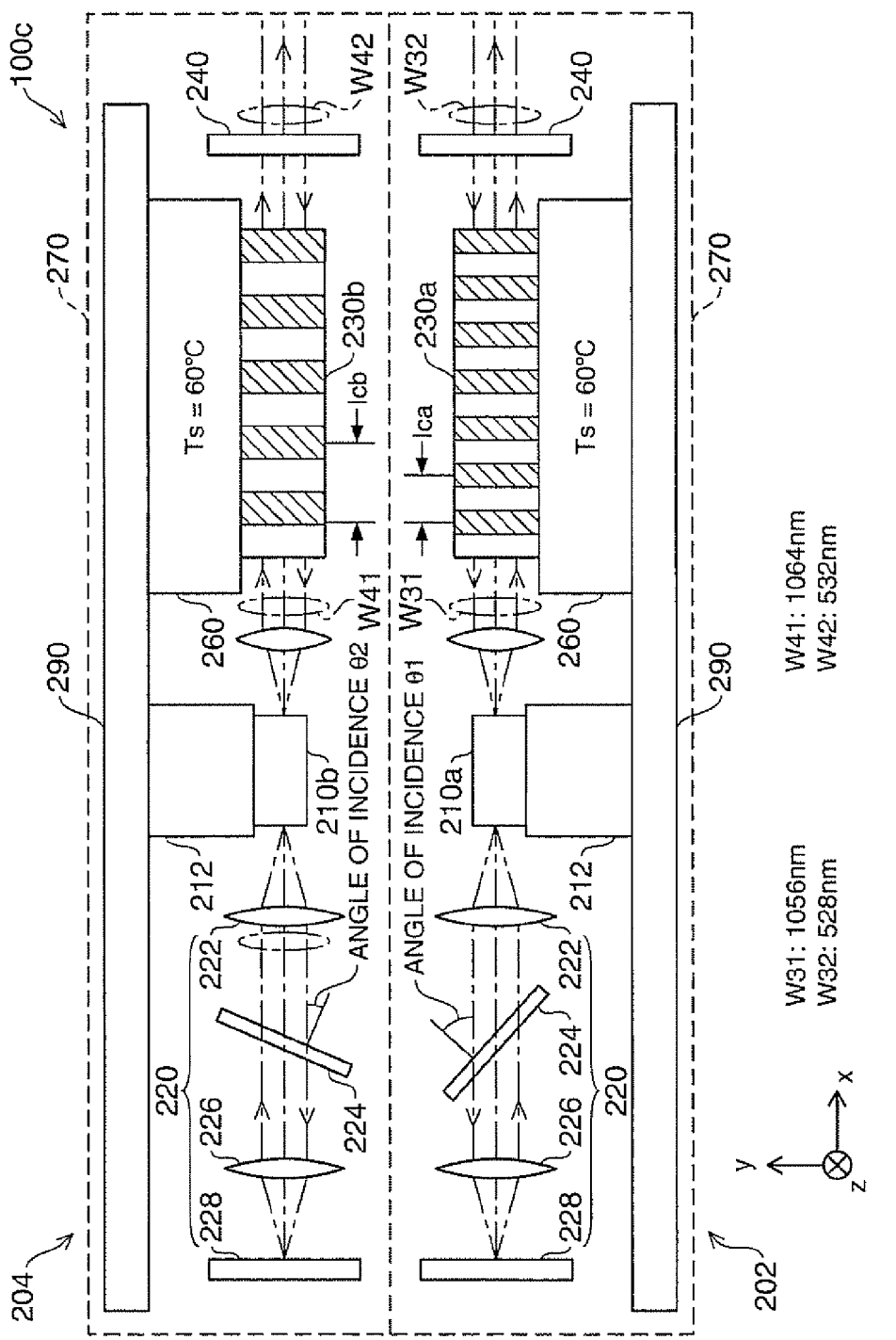
FIG. 7 is a configuration diagram showing the configuration of the laser light source apparatus 100c in a fourth embodiment.

FIG. 7 is a configuration diagram showing the configuration of the laser light source apparatus 100*c* in a fourth embodiment. The laser light source apparatus 100*c* of the fourth embodiment differs from the laser light source apparatus 100*a* of the second embodiment shown in FIGS. 4A and 4B in that edge emitting type laser array elements 210*a* and 210*b* are used as the fundamental wave light sources, and in that an external cavity is provided to adjust the emission wavelength of each of the fundamental wave light beams.

In the laser light source apparatus 100*c* of the fourth embodiment, two laser array light sources 202 and 204 are disposed in such a way that the sides opposite to bases 290 are adjacent to each other, as in the laser light source apparatus 100*a* of the second embodiment. The two laser array light sources 202 and 204 are set in such a way that the exit beams W32 and W42 have wavelengths different from each other.

The laser array light source 202 includes the laser array element 210*a*, a mode locker 220, a collimator lens 214, a wavelength conversion element 230*a*, and a reflection mirror 240. The laser array element 210*a* is an edge emitting type laser array element and has a plurality of laser beam emitting portions arranged in the z direction. The laser array element 210*a* is mounted on the base 290 via a heat sink 212. The collimator lens 214 converts the laser beam emitted from the laser array element 210*a* and traveling in the +x direction into collimated light rays.

The wavelength conversion element 230*a* and the reflection mirror 240 are disposed next to the collimator lens 214 in the +x direction. The wavelength conversion element 230*a* is, as in the second embodiment, an element that generates second harmonic light having a frequency twice as high as the frequency of the fundamental wave light. The wavelength conversion element 230*a* is attached to a Peltier element 260 provided on the base 290. In the embodiment shown in FIG. 7, the domain pitch lca of the wavelength conversion element 230*a* is adjusted in such a way that the optimum conversion wavelength is 1056 nm when the temperature of the wavelength conversion element 230*a* is 60° C. The reflection mirror 240 selectively reflects light having a wavelength of approximately 1060 nm.

The mode locker 220 includes two collimator lenses 222 and 226, a wavelength selection element 224, and a reflection mirror 228. The collimator lens 222 converts the laser beam emitted from the laser array element 210*a* into collimated light rays. The wavelength selection element 224 is an optical element that receives the collimated light rays and selectively transmits light having a specific wavelength. Examples of such an optical element include an etalon and an optical multilayer film, The reflection mirror 228 is disposed at the −x direction-side focal point of the collimator lens 226. The reflection mirror 228 reflects almost all the light having a wavelength of approximately 1060 nm. A reflection mirror formed of an optical multilayer film can be used as the reflection mirror 228. Other examples of the reflection mirror 228 may include, provided that the reflectance of the light having a wavelength of approximately 1060 nm can be sufficiently high, a reflection mirror made of metal, such as an aluminum plate, or a reflection mirror formed of a dielectric body, such as glass, with metal deposited thereon.

The two reflection mirrors 228 and 240 provided in the laser array light source 202 form a cavity. The wavelength selection element 224 is disposed along the optical axis of the cavity. Therefore, in the cavity formed of the two reflection mirrors 228 and 240, resonance occurs at the wavelength of the light that the wavelength selection element 224 selectively transmits (transmission wavelength). In the laser array element 210*a* disposed between the two reflection mirrors 228 and 240, laser oscillation occurs at the resonance wavelength of the laser array light source 202 when the gain of the laser array element 210*a* is sufficiently high at the resonance wavelength. In the example shown in FIG. 7, the resonance wavelength of the laser array light source 202 is set to 1056 nm, which is the optimum conversion wavelength of the wavelength conversion element 230a. Therefore, in the laser array element 210a, laser oscillation occurs at 1056 nm.

Figure 8A:
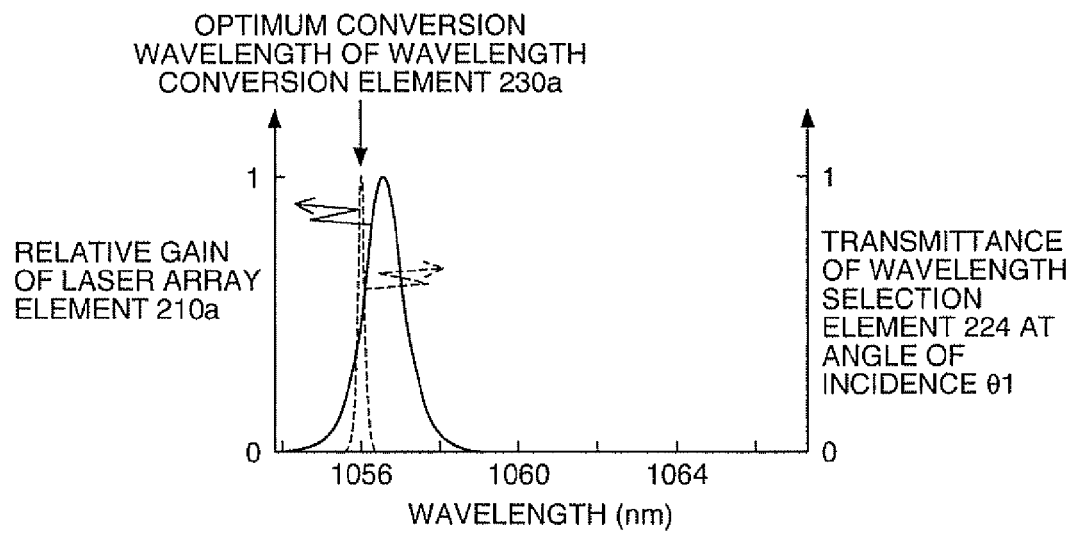
FIGS. 8A and 8B are graphs showing how oscillation occurs in laser array elements 210a and 210b at the resonance wavelengths of laser array light sources 202 and 204 in the fourth embodiment.

FIG. 8A is a graph showing how the oscillation occurs in the laser array element 210a at the resonance wavelength 1056 nm in the first the laser array light source 202. The horizontal axis in FIG. 8A represents the wavelength. The left vertical axis in FIG. 8A represents the relative gain of the laser array element 210a. The relative gain used herein is the gain of the laser array element 210a when the maximum value of the gain is defined as a value of one. The right vertical axis in FIG. 8A represents the transmittance of the wavelength selection element 224 at the angle of incidence θ1 in the first laser array light source. As shown in FIG. 8A, the laser array element 210a has a sufficient gain at the peak transmittance of the wavelength selection element 224 (at 1056 nm). Therefore, the oscillation occurs in the laser array element 210a at the peak transmittance of the wavelength selection element 224, that is, at 1056 nm, which is the resonance wavelength of the laser array light source 202.

Fundamental wave light W31 having a wavelength of 1056 nm, which is emitted from the laser array element 210a when laser oscillation occurs therein, is converted into second harmonic light having a wavelength of 528 nm in the wavelength conversion element 230a. It is noted that in the edge emitting type laser array element 210a, the polarization direction is parallel to the junction plane (z axis direction). Therefore, a wavelength conversion element in which the direction of the polarization domain is oriented in the z direction is used as the wavelength conversion element 230a in the forth embodiment. The second harmonic light W32 produced by the wavelength conversion element 230a passes through the reflection mirror 240 and exits from the laser array light source 202.

The second laser array light source 204 differs from the first laser array light source 202 in that the inclination angle of the wavelength selection element 224 to the optical axis of the cavity (referred to as "resonance direction") is different, and in that the laser array element 210a is replaced with the laser array element 210b. The other components are the same as those in the first laser array light source 202.

When the inclination angle of the wavelength selection element 224 to the resonance direction thus changes, the transmission wavelength of the wavelength selection element 224 changes. In the wavelength selection element 224, such as an etalon and an optical multilayer film, when the angle of incidence becomes larger, the transmission wavelength becomes shorter, while when the angle of incidence becomes smaller, the transmission wavelength becomes longer. In the second laser array light source 204, the angle of incidence θ2 at which the light impinges on the wavelength selection element 224 is smaller than the angle of incidence θ1 in the first laser array light source 202. Therefore, the resonance wavelength in the second laser array light source 204 is longer than the resonance wavelength in the first laser array light source 202. In the example shown in FIG. 7, the resonance wavelength in the second laser array light source 204 is set to 1064 nm, which is the optimum conversion wavelength of the wavelength conversion element 230b.

Figure 8B:
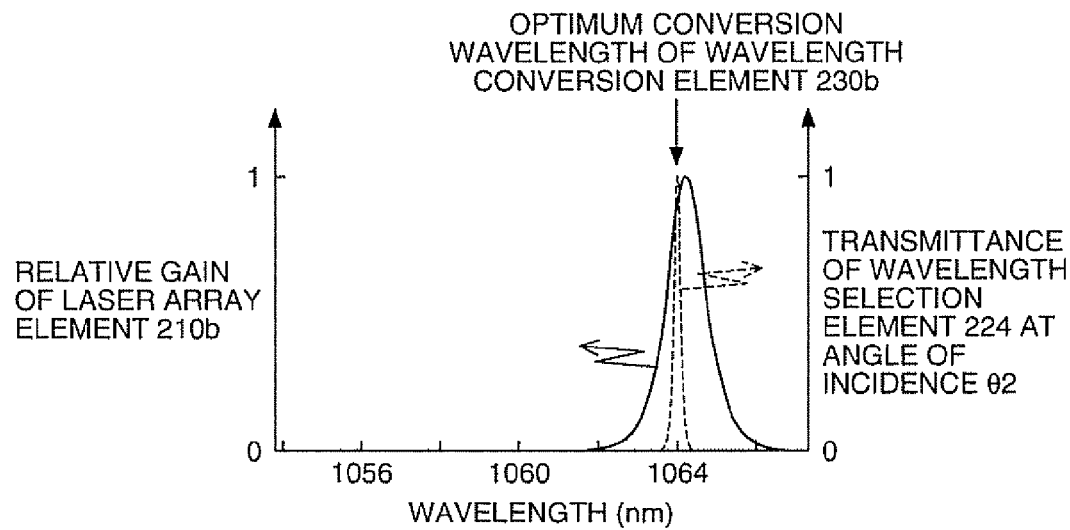

FIG. 8B is a graph showing how the oscillation occurs in the laser array element 210b at the resonance wavelength 1064 nm in the second laser array light source 204. The horizontal axis in FIG. 8B represents the wavelength. The left vertical axis in FIG. 8B represents the relative gain of the laser array element 210b, and the right vertical axis represents the transmittance of the wavelength selection element 224 at the angle of incidence θ2 in the second laser array light source. As shown in FIG. 8B, the laser array element 210b has a sufficient gain at the peak transmittance of the wavelength selection element 224 (at 1064 nm). Therefore, the oscillation occurs in the laser array element 210b at the peak transmittance of the wavelength selection element 224, that is, at 1064 nm, as in the first laser array light source 202, Fundamental wave light W41 having a wavelength of 1064 nm, which is emitted from the laser array element 210b when laser oscillation occurs therein, is converted into second harmonic light having a wavelength of 532 nm in the wavelength conversion element 230b. The second harmonic light W42 produced by the wavelength conversion element 230b passes through the reflection mirror 240 and exits from the laser array light source 204.

As described above, in the fourth embodiment as well, the beams W32 and W42 having wavelengths different from each other exit from the laser light source apparatus 100c. The amount of speckle noise can therefore be reduced, as in the second embodiment. Further, in the fourth embodiment as well, since the first and second laser array light sources 202 and 204 are disposed in such a way that the side surfaces of packages 270 opposite to the bases 290 are adjacent to each other, the distance between the exit beams W32 and W42 can be reduced. It is therefore possible to further reduce the size of the homogenizing optical system 502G (FIG. 1) and further increase the contrast of the light modulated by the liquid crystal light valve 504G (FIG. 1). Further, since the exit beams W32 and W42 are polarized in the same direction, no polarization control element is necessary, so that reduction in the amount of light due to the polarization control element can be smaller.

E. Fifth Embodiment

Figure 9A:
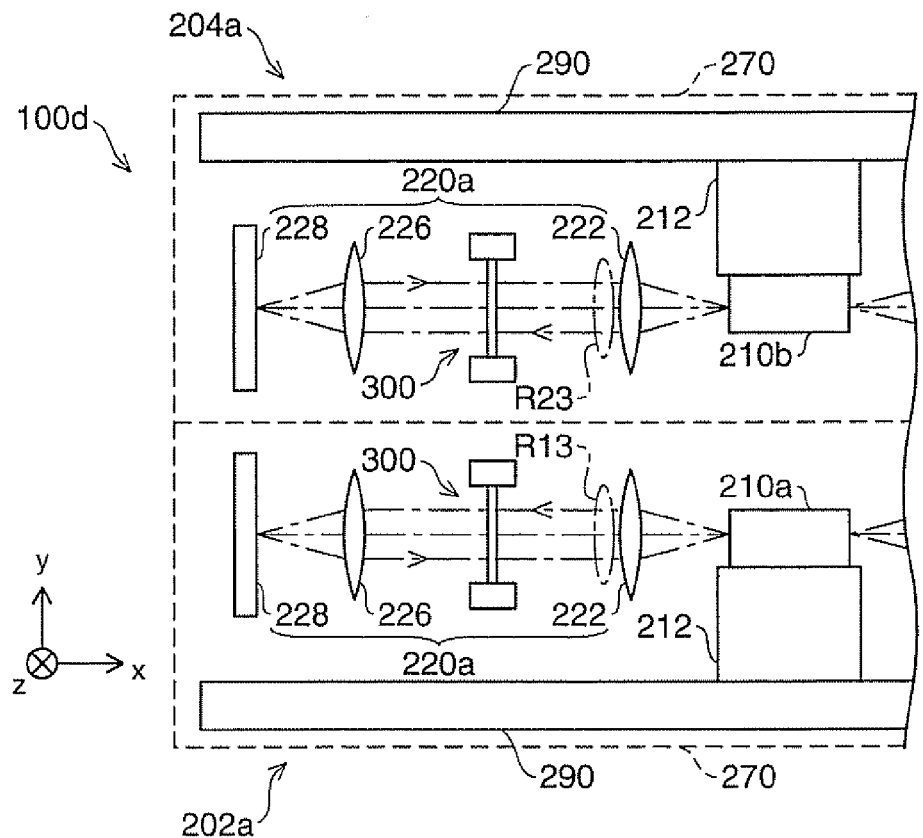
FIGS. 9A and 9B explain the configuration of the laser light source apparatus 100d in a fifth embodiment.

FIG. 9A is a configuration diagram showing the configuration of the laser light source apparatus 100d in a fifth embodiment. The laser light source apparatus 100d of the fifth embodiment differs from the laser light source apparatus of the fourth embodiment in that the wavelength selection element 224 is replaced with an etalon 300 capable of changing the transmission wavelength. In FIG. 9A, the portion beyond the laser array elements 210a and 210b of the laser light source apparatus 100d in the +x direction are omitted.

Figure 9B:
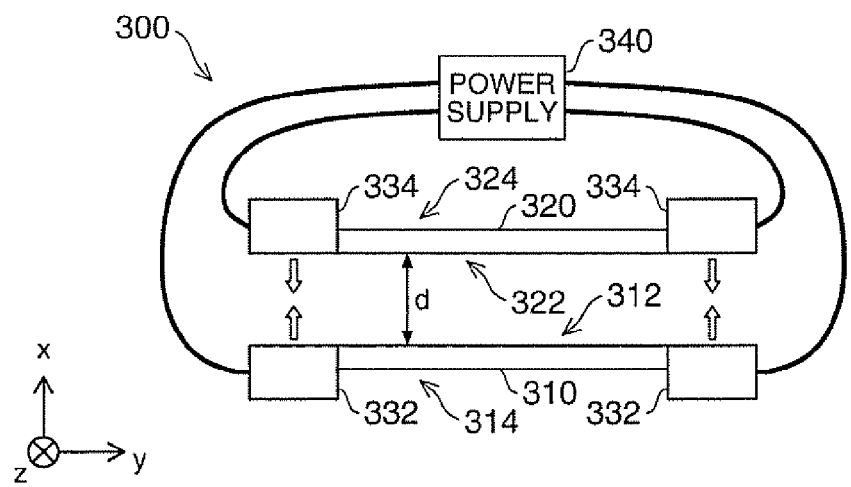

FIG. 9B is a configuration diagram showing the configuration of such a variable wavelength etalon 300, The variable wavelength etalon 300 includes two reflection mirrors 310 and 320, electrostatic actuators 332 and 334 attached to the peripheries of the reflection mirrors 310 and 320, and a power supply 340. The opposing surfaces 312 and 322 of the reflection mirrors 310 and 320 have metal, such as aluminum, deposited thereon for reflectance enhancement. On the other hand, the surfaces 314 and 324 opposite to the surfaces 312 and 322 have anti-reflection films for reflectance reduction. An optical multilayer film is used as the anti-reflection film.

The distance d between the opposing surfaces 312 and 322 is adjusted by using the power supply 340 to adjust the voltage applied between the electrostatic actuators 332 and 334. By adjusting the distance d between the opposing surfaces 312 and 322, the transmission wavelength $\lambda_T$ can be adjusted. In the example shown in FIGS. 9A and 9B, by adjusting the distance d, the transmission wavelength $\lambda_T$ of the variable wavelength etalon 300 in the first laser array light source 202 is set to 1056 nm, and the transmission wavelength $\lambda_T$ of the variable wavelength etalon 300 in the second laser array light source 204 is set to 1064 nm. Therefore, the oscillation occurs at 1056 nm in the laser array element 210a in the first laser array light source 202, and the oscillation occurs at 1064 nm in the laser array element 210b in the second laser array light source 204. Then, as in the fourth embodiment, second harmonic light beams (528 nm and 532 nm) converted from the light beams having these oscillation wavelengths exit from the laser light source apparatus 100d.

In the fifth embodiment as well, since the light beams having wavelengths different from each other thus exit from the laser light source apparatus 100d as in the fourth embodiment, the amount of speckle noise can be reduced. Further, since the distance between the exit beams can be reduced, it is possible to further reduce the size of the homogenizing optical system 502G (FIG. 1) and further increase the contrast of the light modulated by the liquid crystal light valve 504G (FIG. 1). Moreover, since the exit beams are polarized in the same direction, no polarization control element is necessary, so that reduction in the amount of light due to the polarization control element can be smaller.

In the fifth embodiment, although the electrostatic actuators are used to adjust the distance between the reflection mirrors 310 and 320 of the variable wavelength etalon 300, the variable wavelength etalon 300 can be differently configured as long as the distance between the reflection mirrors 310 and 320 can be adjusted. For example, the electrostatic actuators may be replaced with piezoelectric elements to adjust the distance between the reflection mirrors 310 and 320. However, the electrostatic actuator is more preferable in that the power consumption of the variable wavelength etalon can be further reduced.

F. Sixth Embodiment

Figure 10:
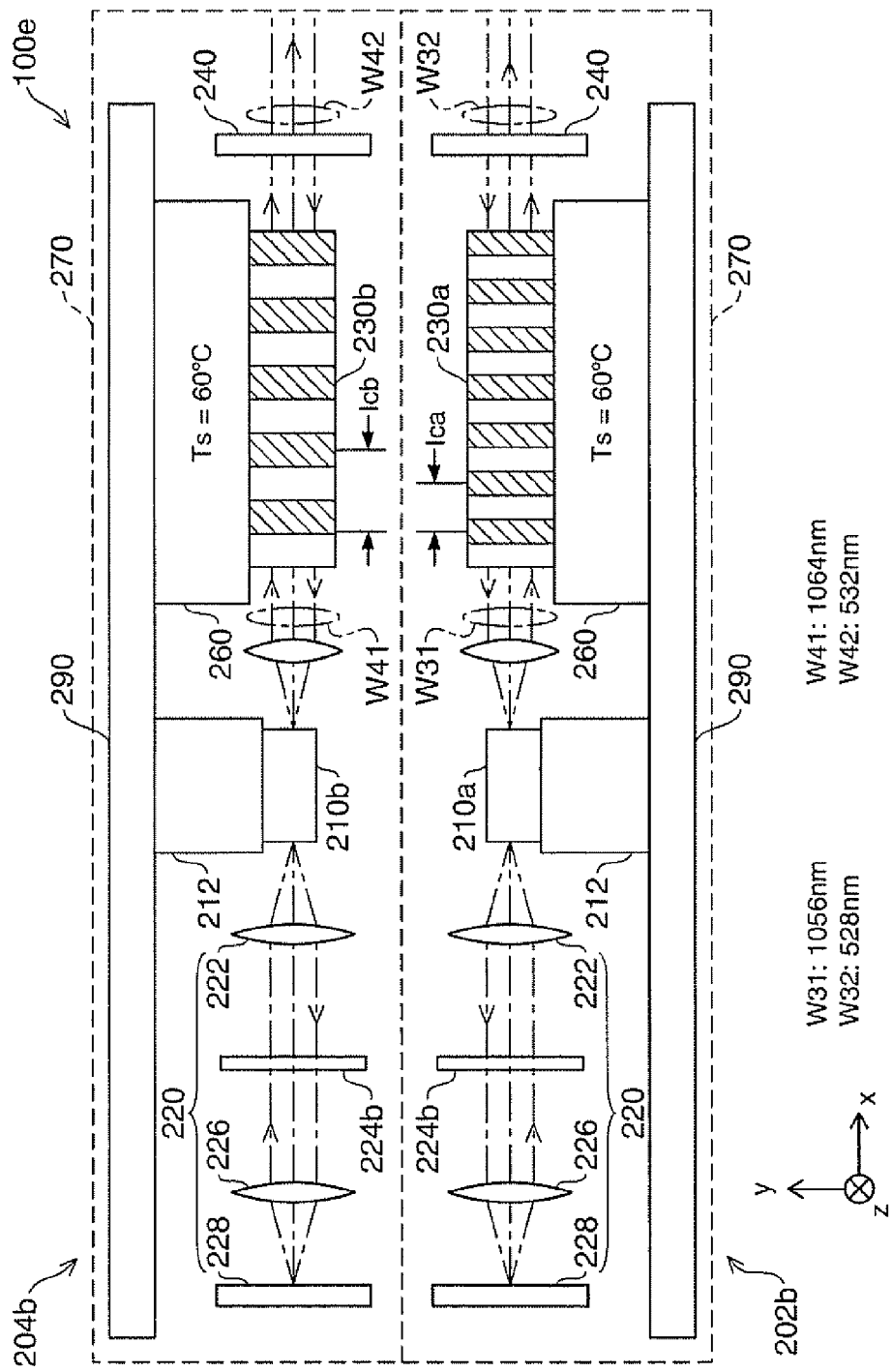
FIG. 10 is a configuration diagram showing the configuration of the laser light source apparatus 100e in a sixth embodiment.

FIG. 10 is a configuration diagram showing the configuration of the laser light source apparatus 100e in a sixth embodiment. The laser light source apparatus 100e of the sixth embodiment differs from the laser light source apparatus 100c of the fourth embodiment shown in FIG. 7 in that the wavelength selection element 224 is replaced with a wavelength selection element 224b. The other components are the same as those in the laser light source apparatus 100c of the fourth embodiment.

The wavelength selection element 224b in the sixth embodiment is an etalon that transmits the light having wavelengths of 1056 nm and 1064 nm. In general, the gap $\Delta\lambda$ between transmission wavelengths $\lambda_T$ of an etalon can be set by adjusting the optical thickness of the etalon as appropriate. In the wavelength selection element 224b in the sixth embodiment, the thickness of the etalon is adjusted in such a way that the wavelength gap $\Delta\lambda$ is 8 nm.

Figure 11A:
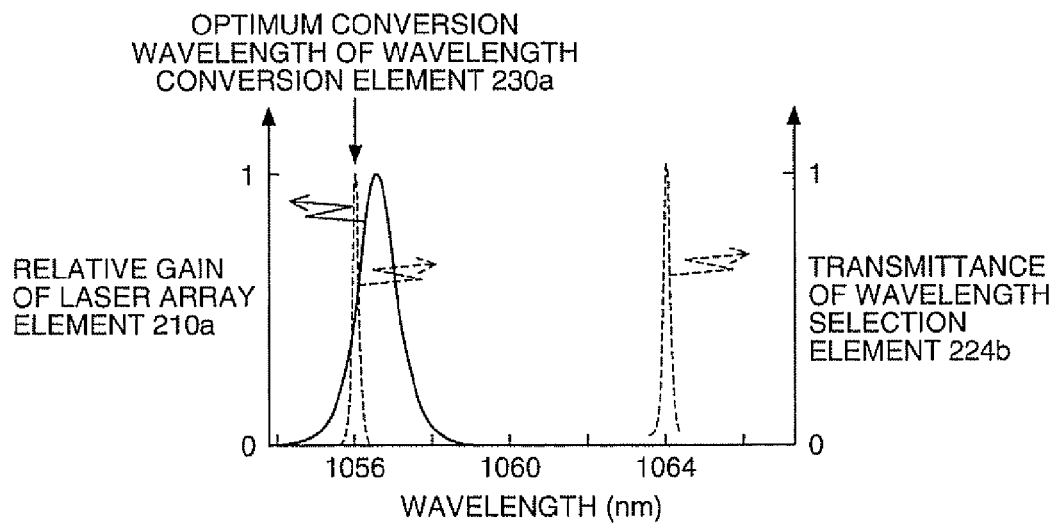
FIGS. 11A and 11B are graphs showing how laser oscillation occurs in laser array elements 210a and 210b.
Figure 11B:
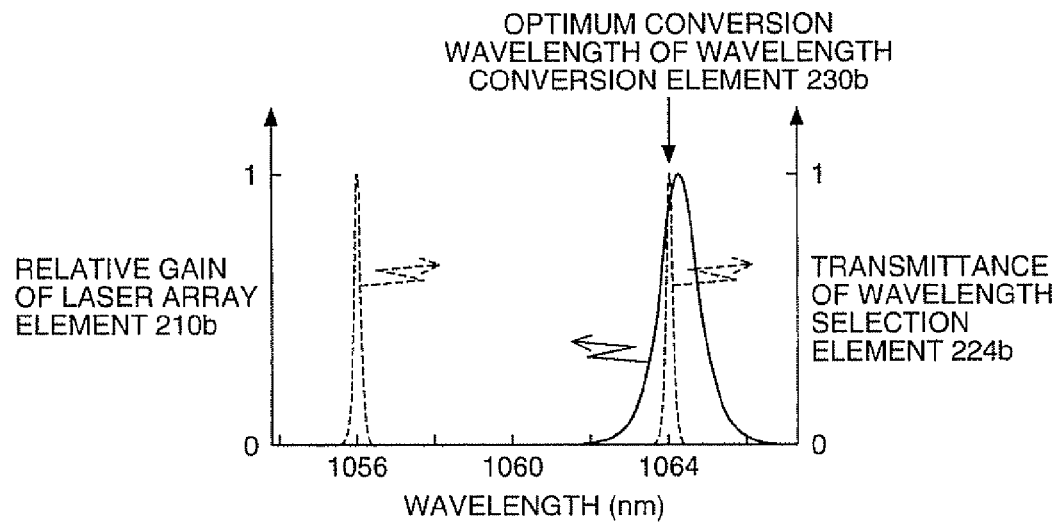

FIGS. 11A and 11B are graphs showing how the laser oscillation occurs in the laser array elements 210a and 210b in laser array light sources 202b and 204b, each using the wavelength selection element 224b having transmission wavelengths $\lambda_T$ thus set at 1056 nm and 1064 nm. In FIGS. 11A and 11B, the horizontal axis represents the wavelength. The left vertical axis in FIG. 11A represents the relative gain of the laser array element 210a, and the left vertical axis in FIG. 11B represents the relative gain of the laser array element 210b. In FIGS. 11A and 11B the right vertical axis represents the transmittance of the wavelength selection element 224b for the light incident at right angles.

As shown in FIGS. 11A and 11B, the wavelength selection element 224b transmits almost all the light having wavelengths of 1056 nm and 1064 nm. As shown in FIG. 11A, the laser array element 210a has a sufficient gain at the first peak transmittance of the wavelength selection element 224b (at 1056 nm). On the other hand, the laser array element 210a does not have a sufficient gain at the second peak transmittance of the wavelength selection element 224b (at 1064 nm). Therefore, the oscillation occurs in the laser array element 210a in the first laser array light source 202b at the first peak transmittance of the wavelength selection element 224b (at 1056 nm). On the other hand, as shown in FIG. 11B, the laser array element 210b does not have a sufficient gain at the first peak transmittance of the wavelength selection element 224b (at 1056 nm), while having a sufficient gain at the second peak (at 1064 nm). Therefore, the oscillation occurs in the laser array element 210b in the second laser array light source 204b at the second peak transmittance of the wavelength selection element 224b (at 1064 nm). As described above, the oscillation occurs at 1056 nm in the laser array element 210a in the first laser array light source 202b, while the oscillation occurs at 1064 nm in the laser array element 210b in the second laser array light source 204b. Therefore, second harmonic light beams (528 nm and 532 nm) converted from the light beams having these wavelengths exit from the laser light source apparatus 100e.

As described above, in the sixth embodiment as well, since the beams W32 and W42 having wavelengths different from each other exit from the laser light source apparatus 100e, the amount of speckle noise can be reduced as in the fourth embodiment. Further, since the distance between the exit beams can be reduced, it is possible to further reduce the size of the homogenizing optical system 502G (FIG. 1) and further increase the contrast of the light modulated by the liquid crystal light valve 504G (FIG. 1). Moreover, since the exit beams are polarized in the same direction, no polarization control element is necessary, so that reduction in the amount of light due to the polarization control element can be smaller.

The sixth embodiment is preferable to the fourth and fifth embodiments in that the oscillation can occur in each of the two laser array light sources 202b and 204b at a plurality of wavelengths without adjusting, for example, the inclination angles of the wavelength selection element 224b. On the other hand, the fourth and fifth embodiments are preferable to the sixth embodiment in that the resonance wavelength can be set to an arbitrary wavelength.

G. Seventh Embodiment

Figure 12:
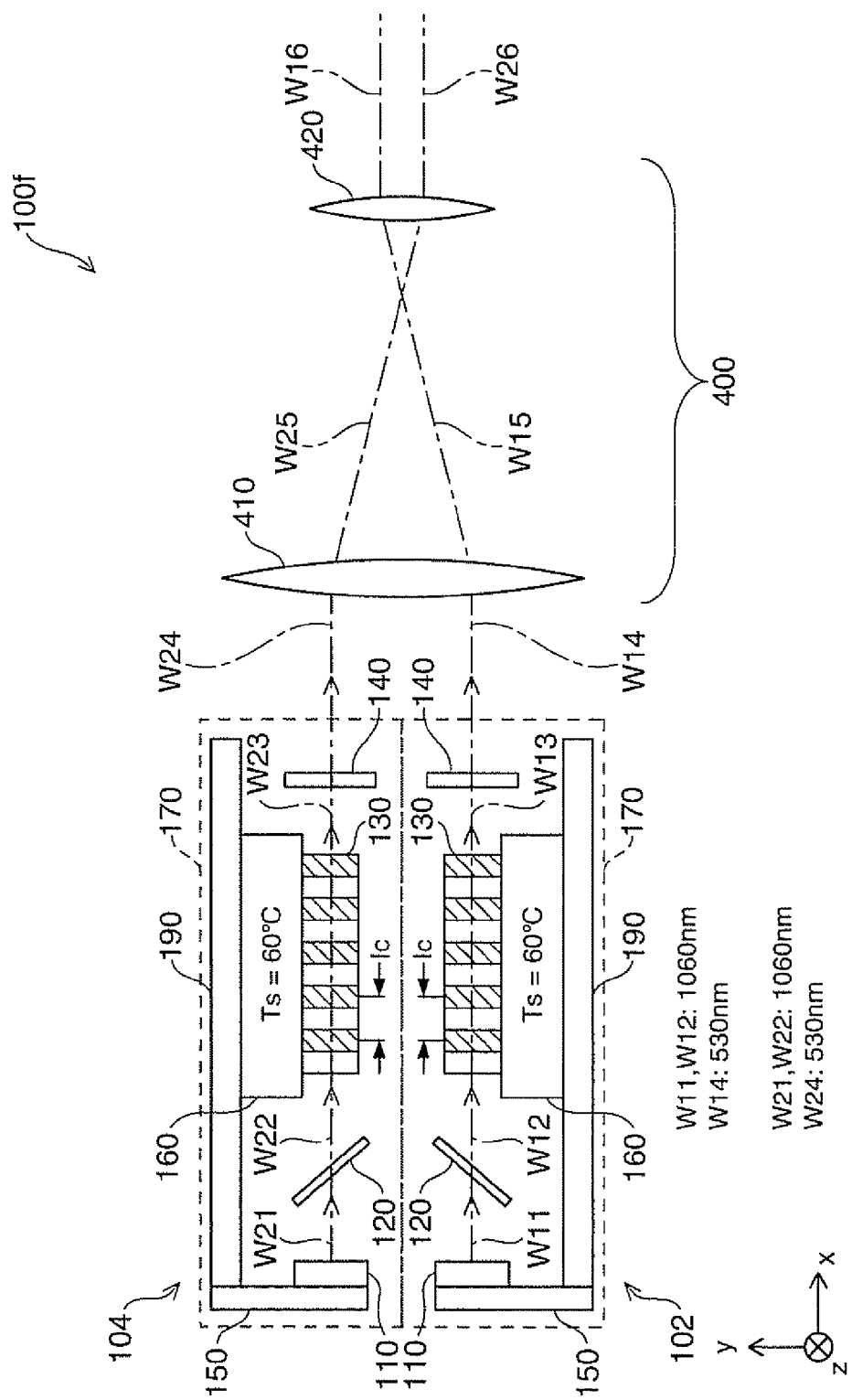
FIG. 12 is a configuration diagram showing the configuration of the laser light source apparatus 100f in a seventh embodiment.

FIG. 12 is a configuration diagram showing the configuration of the laser light source apparatus 100f in a seventh embodiment. The laser light source apparatus 100f of the seventh embodiment is configured in such a way that the laser light source apparatus 100 of the first embodiment is additionally provided with a collector optical system 400.

The collector optical system 400 includes two lenses 410 and 420. Each of the lenses 410 and 420 is a rod-like lens having two cylindrical surfaces. The beams W14 and W24 that exit from the two laser array light sources 102 and 104 are refracted by the first lens 410 and directed in the +y and −y directions, respectively. The second lens 420 converts the two refracted beams W15 and W25 back into the beams W16 and W26 traveling in the +x direction. By thus disposing the collector optical system 400 formed of the two lenses 410 and 420 along the light path of the exit beams W14 and W24 from the laser array light sources 102 and 104, the distance between the beams W16 and W26 that exit from the laser light source apparatus 100f can be reduced.

In the seventh embodiment, by thus reducing the distance between the beams W16 and W26, it is possible to further reduce the size of the homogenizing optical system 502G of the projector 500 (FIG. 1) and further increase the contrast of the light modulated by the liquid crystal light valve 504G.

H. Eighth Embodiment

Figure 13:
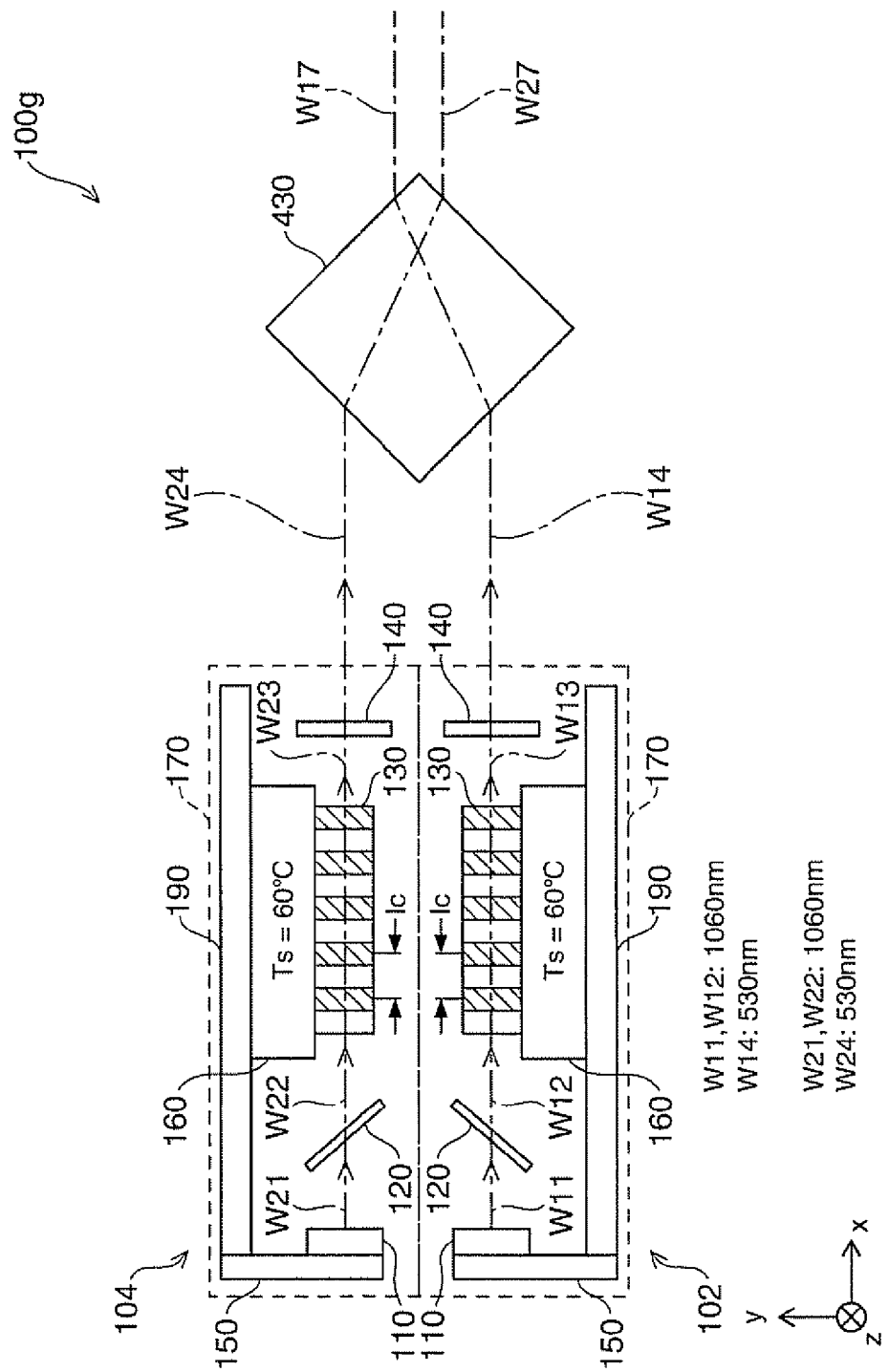
FIG. 13 is a configuration diagram showing the configuration of the laser light source apparatus 100g in an eighth embodiment.

FIG. 13 is a configuration diagram showing the configuration of the laser light source apparatus 100g in an eighth embodiment. The laser light source apparatus 100g of the eighth embodiment differs from the laser light source apparatus 100f of the seventh embodiment shown in FIG. 12 in that the collector optical system 400 is replaced with a square prism-shaped collector block 430. The other components are the same as those in the laser light source apparatus 100f of the seventh embodiment.

The exit beams W14 and W24, which exit from the two laser array light sources 102 and 104 and impinge on the collector block 430 in the laser light source apparatus 100g, are refracted at the −x direction-side surfaces of the collector block 430 and directed in the +y and −y directions respectively. The +x direction-side surfaces of the collector block 430 then convert the refracted beams back into the beams W17 and W27 traveling in the +x direction. In the eighth embodiment as well, by thus disposing the collector block 430 along the light path of the exit beams W14 and W24 from the laser array light sources 102 and 104, the distance between the beams W17 and W27 that exit from the laser light source apparatus 100g can be reduced.

In the eighth embodiment, although the square prism-shaped block 430 is used as the collector block, any collector block can be used as long as its cross-sectional shape in the xy plane is a parallelogram. In this case, the collector block is disposed as appropriate according to the shape of the collector block.

I. Ninth Embodiment

Figure 14:
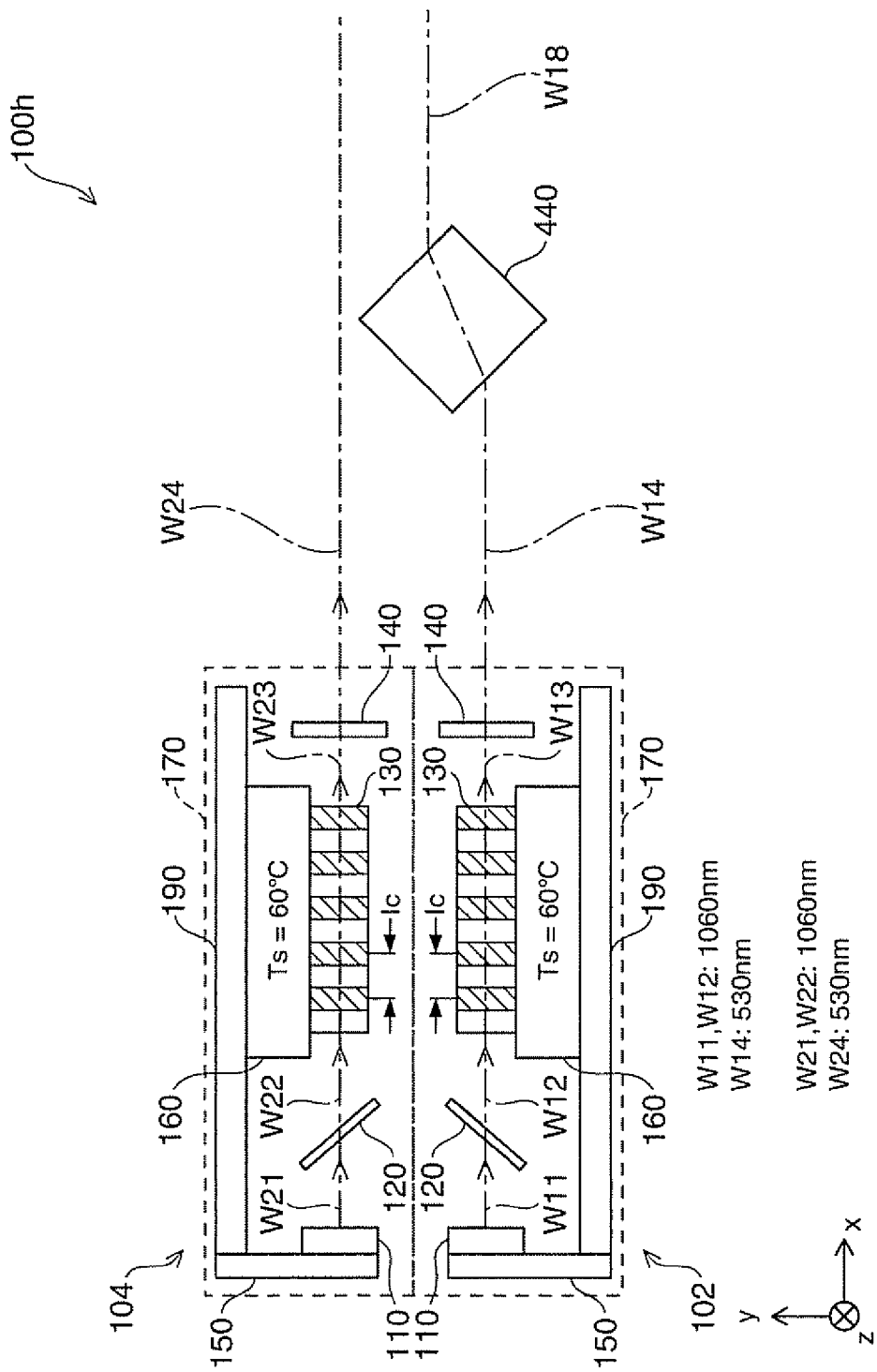
FIG. 14 is a configuration diagram showing the configuration of the laser light source apparatus 100h in a ninth embodiment.

FIG. 14 is a configuration diagram showing the configuration of the laser light source apparatus 100h in a ninth embodiment. The laser light source apparatus 100h of the ninth embodiment differs from the laser light source apparatus 100g of the eighth embodiment shown in FIG. 13 in that a square prism-shaped collector block 440 is disposed along the light path of the exit beam W14 from the first laser array light source 102. The other components are the same as those in the laser light source apparatus 100g of the eighth embodiment.

The beam W14 that exits from the laser array light source 102 and impinge on the collector block 440 in the laser light source apparatus 100h is refracted at the −x direction-side surface of the collector block 440 and directed in the +y direction. The +x direction-side surface of the collector block 440 then converts the refracted beam back into the beam W18 traveling in the +x direction. In the ninth embodiment as well, by thus disposing the collector block 440 along the light path of the exit beam W14 from the laser array light source 102, the distance between the beams W18 and W24 that exit from the laser light source apparatus 100h can be reduced.

J. Tenth Embodiment

Figure 15:
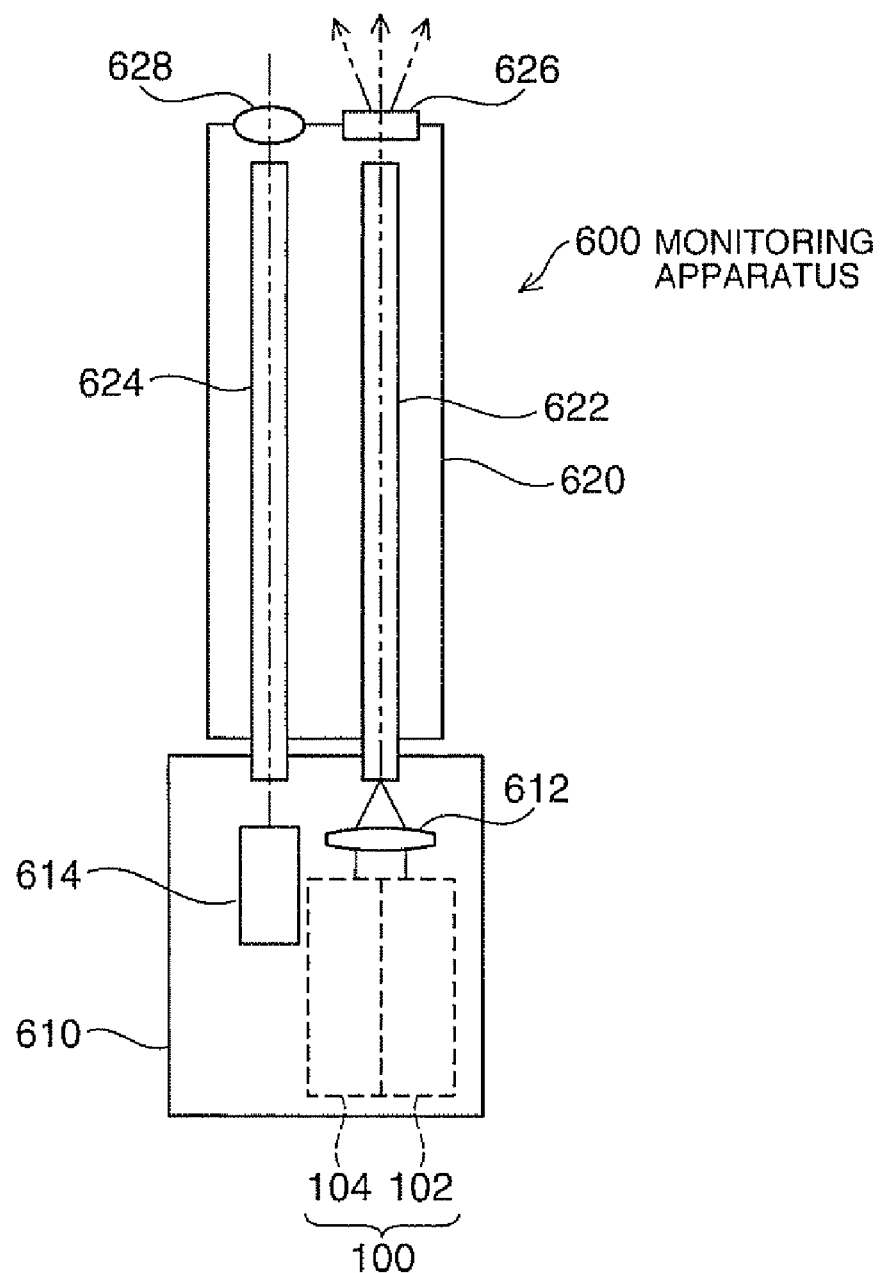
FIG. 15 is a schematic configuration diagram of a monitoring apparatus to which any of the laser light source apparatuses of the invention is applied.

FIG. 15 is a schematic configuration diagram of a monitoring apparatus to which any of the laser light source apparatuses of the invention is applied. The monitoring apparatus 600 includes an apparatus body 610 and a light transmitter 620. The apparatus body 610 includes the laser light source apparatus 100 in the first embodiment (FIGS. 3A and 3B). The apparatus body 610 also includes a collector lens 612 and a camera 614.

The light transmitter 620 includes a light-transmitting lightguide 622 and a light-receiving lightguide 624. Each of the lightguides 622 and 624 is formed of a large number of optical fibers bundled, and capable of transmitting laser light to a remote location. The laser light source apparatus 100 formed of the two laser array light sources 102, 104 and the collector lens 612 are disposed on the light incident side of the light-transmitting lightguide 622. A diffuser plate 626 is disposed on the light exiting side of the lightguide 622. An imaging lens 628 is disposed on the light incident side of the light-receiving lightguide 624.

The laser light that exits from the laser light source apparatus 100 is collected by the collector lens 612, passes through the lightguide 622, is diffused by the diffuser plate 626, and illuminates a subject. The light reflected off the subject enters the imaging lens 628, and passes through the lightguide 624 to the camera 614. In this way, the camera 614 can acquire an image based on the light reflected off the subject illuminated with the laser light that exits from the laser light source apparatus 100.

When the laser light source apparatus 100 is thus applied to the monitoring apparatus 600, the distance between the beams W14 and W24 emitted from the laser array light sources 102 and 104 is reduced, so that the size of the collector lens 612 can be further reduced. Further, since the angle of incidence at which the light impinges on the lightguide 622 can be reduced, the laser light can be transmitted to a subject in a more reliable manner even when the numerical aperture (NA) of the lightguide 622 is small. In the monitoring apparatus 600, the laser light source apparatus 100 may be replaced with any of the laser light source apparatuses 100a to 100h described above.

K. Variations

The invention is not limited to the above examples and embodiment, but can be implemented in various aspects to the extent that they do not depart from the spirit of the invention. For example, the following variations are possible.

K1. First Variation

In each of the above embodiments, although the laser array light source that is part of any of the laser light source apparatuses of the invention includes a wavelength conversion element, the laser array light source may not necessarily include a wavelength conversion element. In general, the invention can be applied to any laser array light source as long as it has an elongated region from which laser light exits (laser light exit region) and the laser light exit region is offset from the center of the laser array light source in the minor axis direction thereof.

Figure 16A:
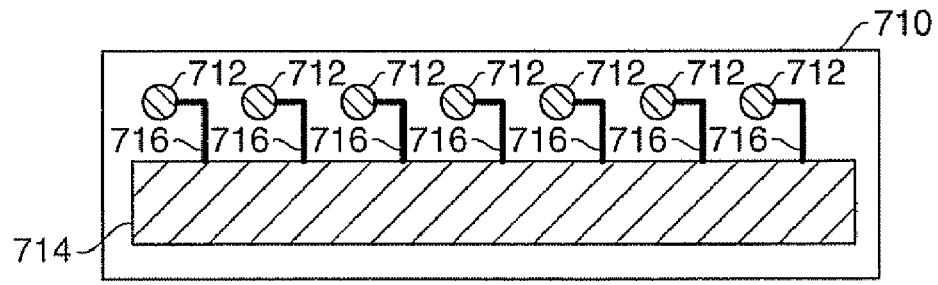
FIGS. 16A and 16B show an exemplary variation in which the invention is applied to an individual VCSEL array 710.
Figure 16B:
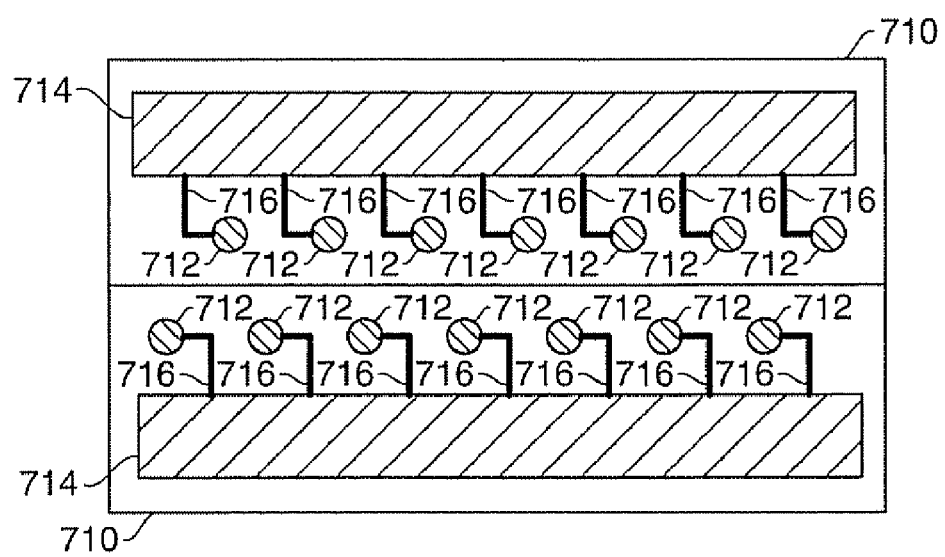

The invention can also be applied, for example, to an individual VCSEL array 710 as shown in FIGS. 16A and 16B. In this case, the individual VCSEL array 710 corresponds to the laser array light source unit of the invention. The VCSEL array 710 shown in FIG. 16A has seven light emitting portions 712 on the +y direction side of the VCSEL array 710 and one bonding pad 714 on the −y direction side. Each of the light emitting portions 712 is connected to the bonding pad 714 through a wiring line 716. When the light emitting portions 712 are thus offset from the center of the VCSEL array 710, and two VCSEL arrays 710 are disposed in such a way that the side surfaces thereof close to the light emitting portions 712 are adjacent to each other as shown in FIG. 16B, the distance between the laser light beams emitted from the two VCSEL arrays 710 can be reduced.

As shown in FIG. 16B, by thus disposing the two VCSEL arrays 710, the laser light beams emitted from the VCSEL arrays 710 can be introduced into one wavelength conversion element. The one wavelength conversion element can then wavelength-converts the light beams emitted from the two VCSEL arrays 710.

K2. Second Variation

In each of the above embodiments, the two laser array light sources are disposed in such a way that the packages are in contact with each other along their y axis direction-side surfaces. However, when a connection unit, such as a connector, is provided on the package in the y axis direction, the two laser array light sources are disposed in such a way that the surfaces opposite to the connectors are adjacent to each other. The length of the connector in the y axis direction is typically longer than the offset of the laser light exit region in the package. By disposing the laser array light sources in such a way that the surfaces opposite to the connectors are adjacent to each other, the laser light exit region is offset from the center of the laser array light source unit including the connector toward the laser array light source unit connection side. The distance between the beams that exit from the two laser array light sources can thus be reduced.

K3. Third Variation

In each of the above embodiments, although the laser array light source is disposed in such a way that the polarization direction of the exit beam from the laser light source apparatus is oriented in a specific direction, the polarization direction of the exit beam from the laser light source apparatus may not be oriented in a specific direction. For example, as shown in the exemplary variation in FIGS. 16A and 16B, which is a laser light source apparatus in which the individual VCSEL array 710 is disposed, the laser light source apparatus may output a beam having no specific polarization component. However, when a device, such as the liquid crystal light valves 504R, 504G, and 504B, illuminated by a laser light source apparatus uses light having a specific polarization direction, the polarization direction of the exit beam from the laser light source apparatus is preferably oriented in a specific direction.

K4. Fourth Variation

In each of the above embodiments, although the laser array light source in any of the laser light source apparatuses 100 to 100*h* has a one-dimensional array structure, the laser array light source may have a two-dimensional structure. In this case, when the laser light exit region of the laser array light source has an elongated shape, and the laser array light source is disposed in the same manner as in the above embodiments, the distance between the beams that exit from the individual laser array light sources can be reduced.

K5. Fifth Variation

In the first to tenth embodiments, although the two laser array light sources are disposed in such a way that the distance between the beams that exit from the two laser array light sources is reduced, two or more laser array light sources can be disposed in an arbitrary layout. Further, the shape of the laser light exit region of the laser array light source as well as the positional relationship between the laser light exit region and the outer shape of the laser array light source can be arbitrary set. In general, when at least two laser array light sources of two or more laser array light sources output light beams having wavelengths different from one another, the coherence of the exit light from the laser light source apparatus can be reduced. It is therefore possible to reduce the amount of speckle noise caused by the illumination provided from the laser light source apparatus.

K6. Sixth Variation

In the seventh to ninth embodiments, although the corresponding of the collector optical systems 400, 430, and 440 are added to the laser array light source 100 of the first embodiment, any of the collector optical systems 400, 430, and 440 may be added to any of the laser array light sources 100*a* to 100*e* of the second to eighth embodiments.

K7. Seventh Variation

In each of the above embodiments, although the light modulator in the projector 500 is a liquid crystal light valve, the light modulator is not limited thereto. For example, the light modulator may be any other modulator, such as a DMD (Digital micromirror Device: a trademark of Texas Instruments), The laser light source apparatuses 100 to 100*h* in the above embodiments can be used not only in the projector 500 (FIG. 1) and the monitoring apparatus 600 (FIG. 15) but also in any apparatus that requires a light source, such as an illumination apparatus.

The entire disclosure of Japanese Patent Application No. 2007-011336, filed Jan. 22, 2007 is expressly incorporated by reference herein.

What is claimed is:

1. A laser light source apparatus comprising:
a first laser array light source that emits a first-wavelength light;
a first package that houses the first laser array light source;
a second laser array light source that emits a second-wavelength light, the second wavelength being different from the first wavelength; and
a second package that houses the second laser array light source,
wherein the first laser array light source includes
a first fundamental wave laser array that produces a first fundamental wave light having a first original wavelength, and
a first wavelength conversion element that wavelength-converts the first fundamental wave light into the first-wavelength light having a color, and
the second laser array light source includes
a second fundamental wave laser array that produces a second fundamental wave light having a second original wavelength different from the first original wavelength, and
a second wavelength conversion element that wavelength-converts the second fundamental wave light into the second-wavelength light having a same color as the first-wavelength light,
the first package and the second package are disposed adjacent to each other,
each of the first and second fundamental wave laser arrays includes
first and second mirrors that reflect light having the first and second original wavelengths and hence form a cavity, and
a wavelength selection element and a gain medium provided between the first and second mirrors, the wavelength selection element selectively transmitting light having a specific wavelength, the gain medium having a gain band for a specific wavelength range,
the wavelength selection elements in the first and second fundamental wave laser arrays are of the same type,
the wavelength selection element in the first fundamental wave laser array transmits the light having the first original wavelength,
the gain band of the gain medium in the first fundamental wave laser array is set in such a way that laser oscillation occurs in the gain medium at the first original wavelength,
the wavelength selection element in the second fundamental wave laser array transmits the light having the second original wavelength,
the gain band of the gain medium in the second fundamental wave laser array is set in such a way that laser oscillation occurs in the gain medium at the second original wavelength,
the wavelength selection elements in the first and second fundamental wave laser arrays have the same transmission characteristic in which the selectively transmitted wavelength changes according to the angle at which the incident light impinges on the wavelength selection element, and the wavelength selection elements in the first and second fundamental wave laser arrays are disposed in such a way that the inclination angle of the wavelength selection element to the resonance direction of the cavity in the first fundamental wave laser array differs from the inclination angle of the wavelength selection element to the resonance direction of the cavity in the second fundamental wave laser array.

2. A laser light source apparatus comprising:
a first laser array light source that emits a first-wavelength light;
a first package that houses the first laser array light source;
a second laser array light source that emits a second-wavelength light, the second wavelength being different from the first wavelength; and
a second package that houses the second laser array light source,
wherein the first laser array light source includes
a first fundamental wave laser array that produces a first fundamental wave light having a first original wavelength, and
a first wavelength conversion element that wavelength-converts the first fundamental wave light into the first-wavelength light having a color, and
the second laser array light source includes
a second fundamental wave laser array that produces a second fundamental wave light having a second original wavelength different from the first original wavelength, and
a second wavelength conversion element that wavelength-converts the second fundamental wave light into the second-wavelength light having a same color as the first-wavelength light,
the first package and the second package are disposed adjacent to each other,
each of the first and second fundamental wave laser arrays includes
first and second mirrors that reflect light having the first and second original wavelengths and hence form a cavity, and
a wavelength selection element and a gain medium provided between the first and second mirrors, the wavelength selection element selectively transmitting light having a specific wavelength, the gain medium having a gain band for a specific wavelength range,
the wavelength selection elements in the first and second fundamental wave laser arrays are of the same type,
the wavelength selection element in the first fundamental wave laser array transmits the light having the first original wavelength,
the gain band of the gain medium in the first fundamental wave laser array is set in such a way that laser oscillation occurs in the gain medium at the first original wavelength,
the wavelength selection element in the second fundamental wave laser array transmits the light having the second original wavelength,
the gain band of the gain medium in the second fundamental wave laser array is set in such a way that laser oscillation occurs in the gain medium at the second original wavelength,
each of the wavelength selection elements of the same type uses an actuator provided therein to change the wavelength selection state thereof so as to change the selectively transmitted wavelength, and the wavelength selection state of the wavelength selection element in the first fundamental wave laser array is set to be different from that of the wavelength selection element in the second fundamental wave laser array.

3. The laser light source apparatus according to claim 1, wherein the wavelength selection elements in the first and second fundamental wave laser arrays have the same transmission characteristic that allows selective transmission of both the first and second original wavelengths.

4. The laser light source apparatus according to claim 1, wherein each of the first and second wavelength conversion elements has different wavelength conversion efficiencies for different wavelengths of the fundamental wave light,
the wavelength conversion element in the first laser array light source has higher wavelength conversion efficiency at the first original wavelength than at the second original wavelength, and
the wavelength conversion element in the second laser array light source has higher wavelength conversion efficiency at the second original wavelength than at the first original wavelength.

5. The laser light source apparatus according to claim 1, wherein the first and second wavelength conversion elements are of the same type in which the wavelength conversion efficiency which changes with temperature is higher than a predetermined efficiency,
the first laser array light source has a first temperature adjuster that adjusts the temperature of the first wavelength conversion element in such a way that the wavelength conversion efficiency at the first original wavelength is higher than the predetermined efficiency, and
the second laser array light source has a second temperature adjuster that adjusts the temperature of the second wavelength conversion element in such a way that the wavelength conversion efficiency at the second original wavelength is higher than the predetermined efficiency.

6. A monitoring apparatus comprising:
the laser light source apparatus according to claim 1; and
an imager that images a subject illuminated by the laser light source apparatus.

7. An image display apparatus comprising:
the laser light source apparatus according to claim 1;
a light modulator that modulates the laser light that exits from the laser light source apparatus according to an image signal; and
a projection optical system that projects the image formed by the light modulator.

8. The laser light source apparatus according to claim 1, wherein
the first package has a base, the first laser array light source being disposed on a surface of the base of the first package,
the second package has a base, the second laser array light source being disposed on a surface of the base of the second package, and
the first package and the second package are arranged such that the surfaces of the bases on which the first and second laser array light sources are disposed are facing each other.

* * * * *